(12) United States Patent
Tsuchiaki

(10) Patent No.: US 7,696,575 B2
(45) Date of Patent: Apr. 13, 2010

(54) SEMICONDUCTOR DEVICE AND METHOD OF MANUFACTURE THEREOF

(75) Inventor: Masakatsu Tsuchiaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 11/668,694

(22) Filed: Jan. 30, 2007

(65) Prior Publication Data

US 2007/0176209 A1    Aug. 2, 2007

(30) Foreign Application Priority Data

Feb. 1, 2006    (JP) .............................. 2006-024883

(51) Int. Cl.
*H01L 27/085* (2006.01)
(52) U.S. Cl. .............................. 257/361; 257/E27.046; 257/E21.632; 257/371; 257/414; 257/369
(58) Field of Classification Search ........................ None
See application file for complete search history.

(56) References Cited

U.S. PATENT DOCUMENTS

2004/0235236 A1\* 11/2004 Hoffmann et al. ........... 438/231
2005/0083375 A1\*  4/2005 Huang et al. ................... 347/54
2006/0284255 A1\* 12/2006 Shin et al. .................... 257/351

OTHER PUBLICATIONS

H. Irie, et al., "In-Plane Mobility Anisotropy and Universality Under Uni-axial Strains in n- and p-MOS Inversion Layers on (100), (110), and (111) Si", IEEE, IEDM Tech. Dig. , 2004, 4 Pages.
T. Ghani, et al., "A 90nm High Volume Manufacturing Logic Technology Featuring Novel 45nm Gate Length Strained Silicon CMOS Transistors", IEEE, IEDM Tech. Dig., 2003, 3 Pages.

\* cited by examiner

*Primary Examiner*—Minh-Loan T Tran
*Assistant Examiner*—Fei Fei Young Lopez
(74) *Attorney, Agent, or Firm*—Oblon, Spivak, McClelland, Maier & Neustadt, L.L.P.

(57) ABSTRACT

A semiconductor device of complementary structure with increased carrier mobilities of both polarities by applying orientation-dependent mechanical stresses to their respective semiconductor channel regions, comprises a semiconductor region subjected to compressive stress in a first direction along a surface and tensile stress in a second direction different from the first direction, a field effect transistor of a first conductivity type formed in the semiconductor region and including source and drain regions separately arranged along the first direction and a field effect transistor of a second conductivity type formed in the semiconductor region and including source and drain regions separately arranged along the second direction.

7 Claims, 18 Drawing Sheets

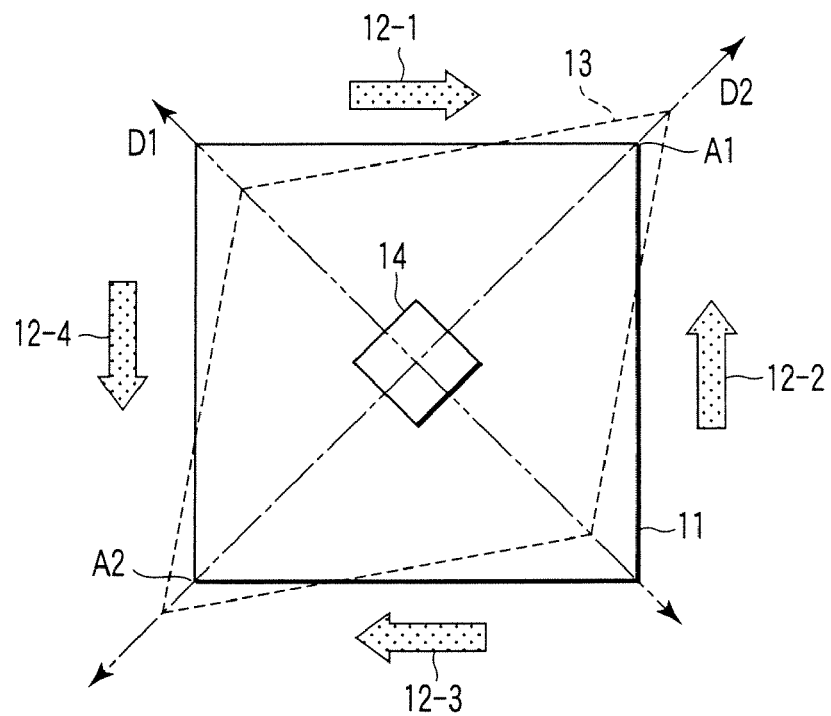
F I G. 1A
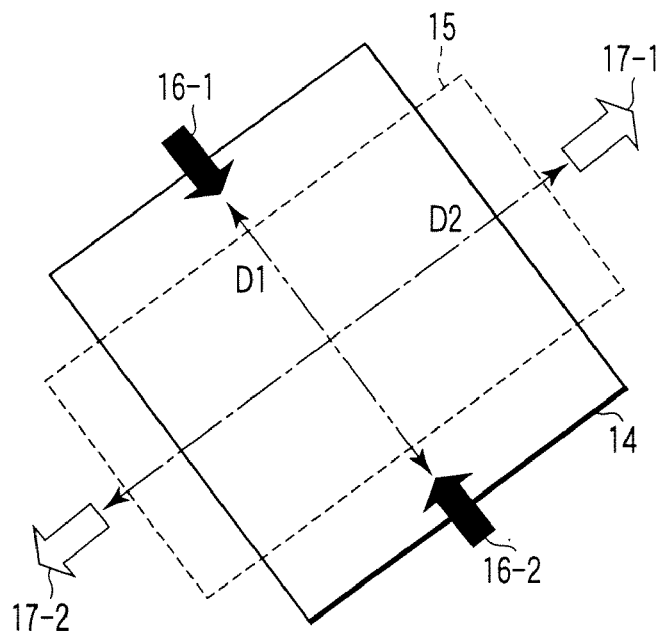
F I G. 1B

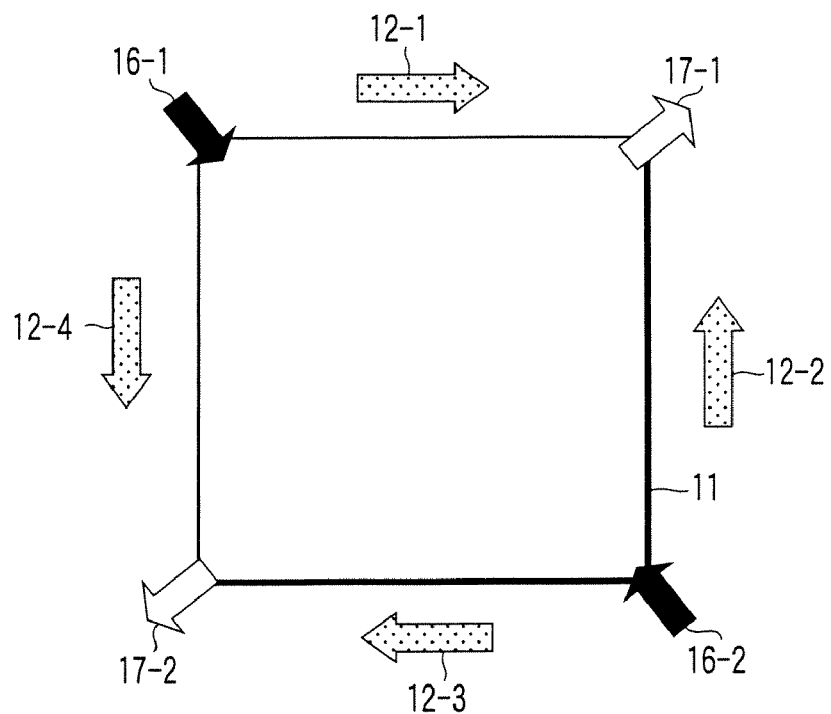
F I G. 2A
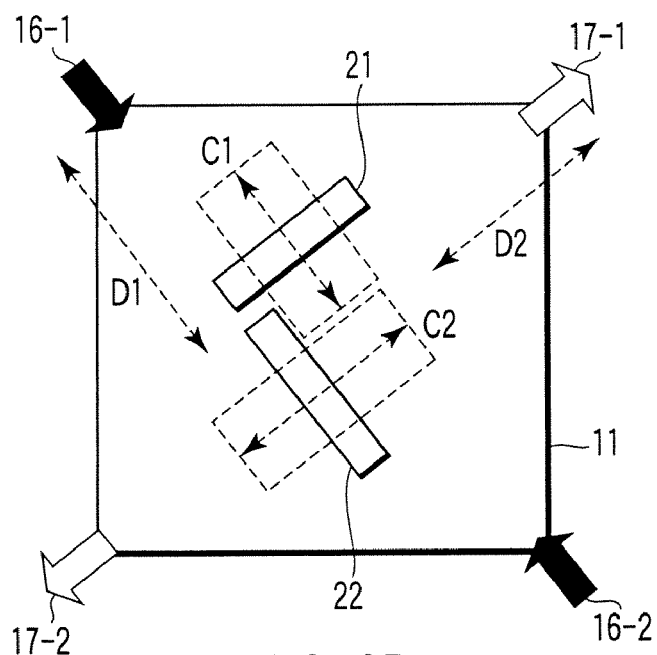
F I G. 2B

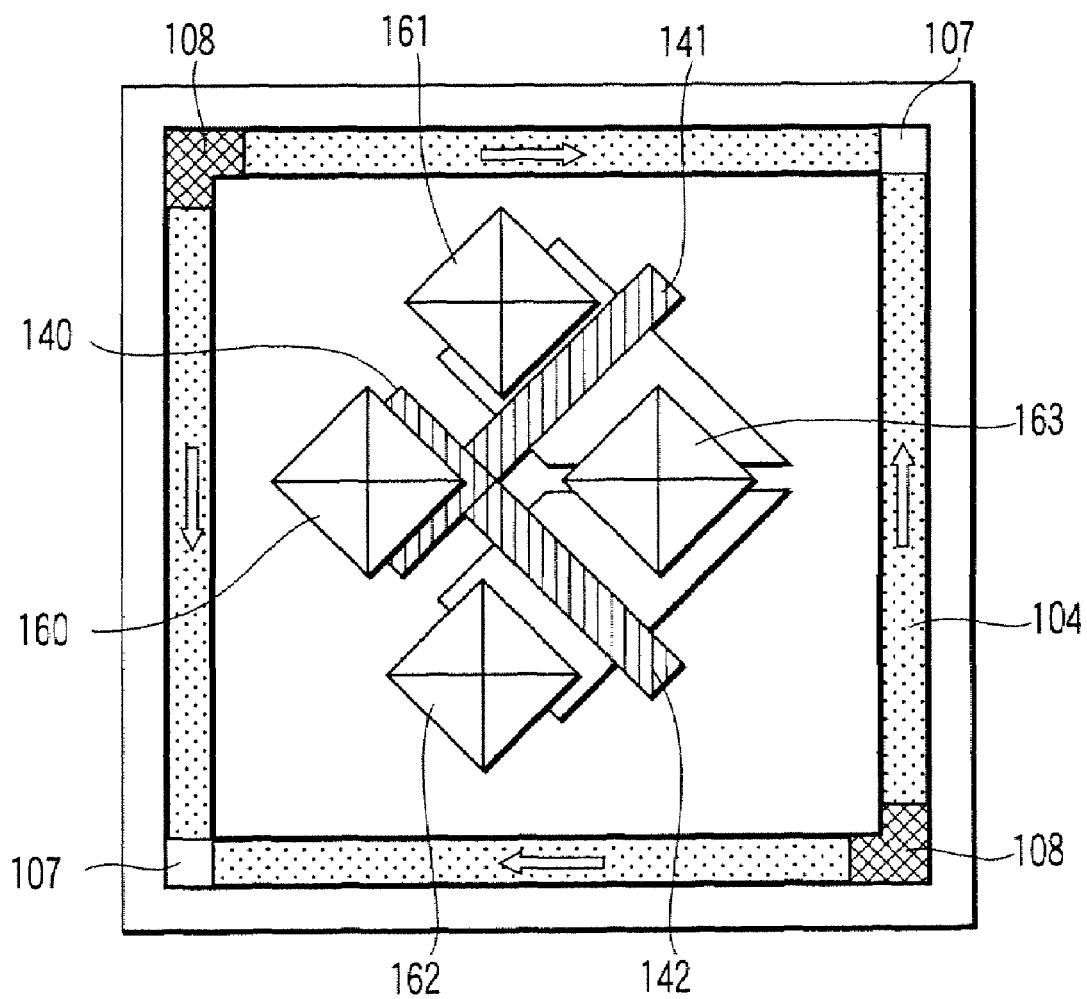
F I G. 4

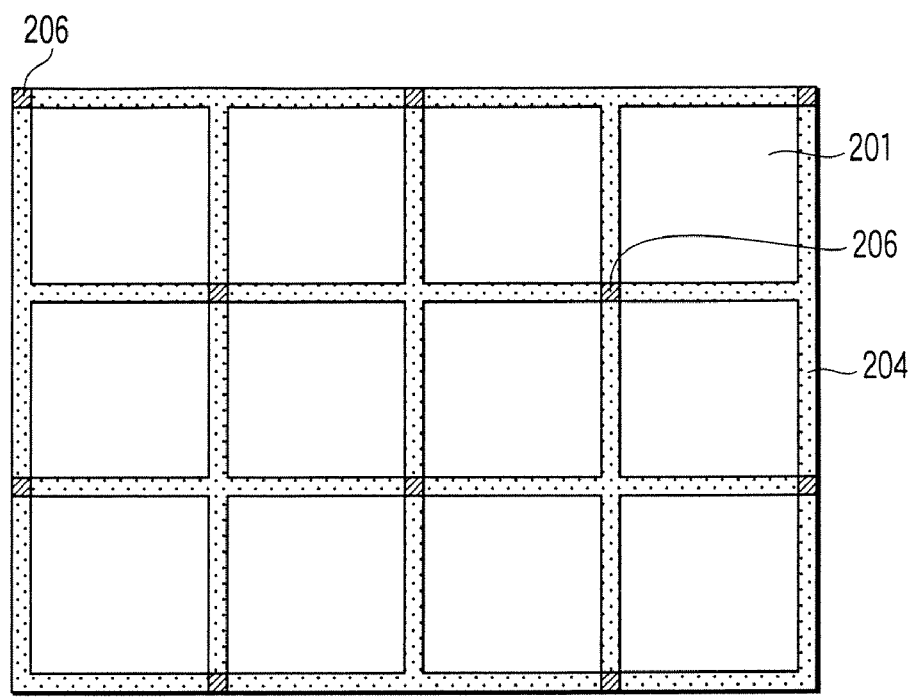
F I G. 6C
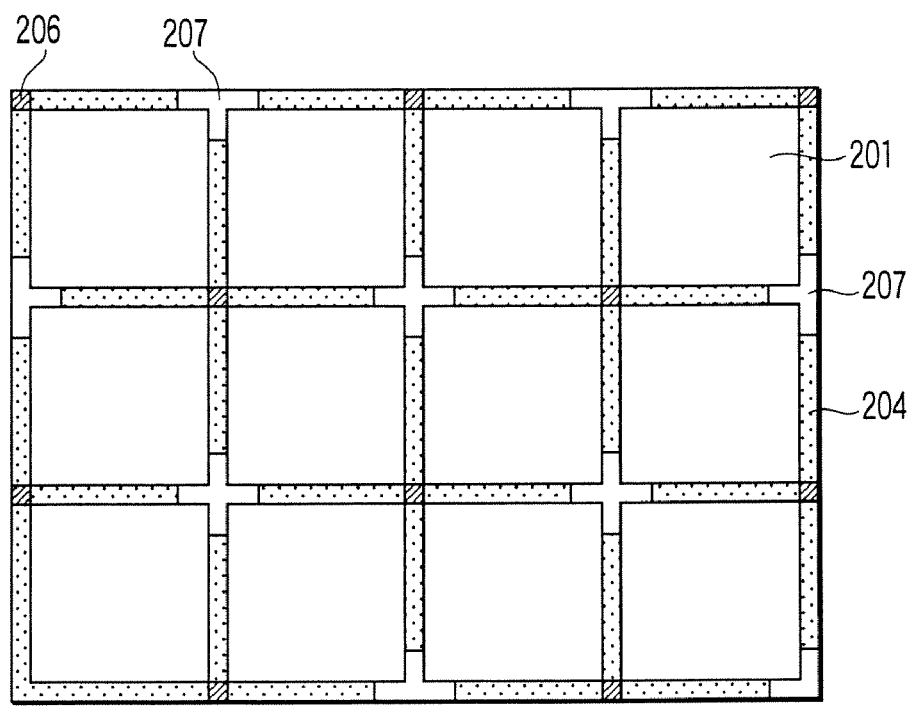
F I G. 6D

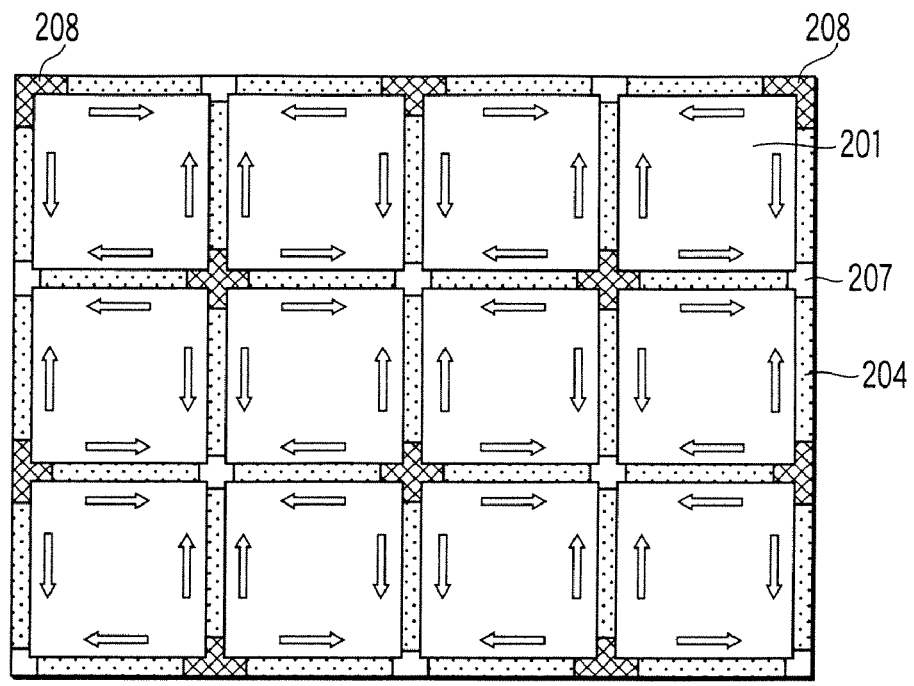
F I G. 6E
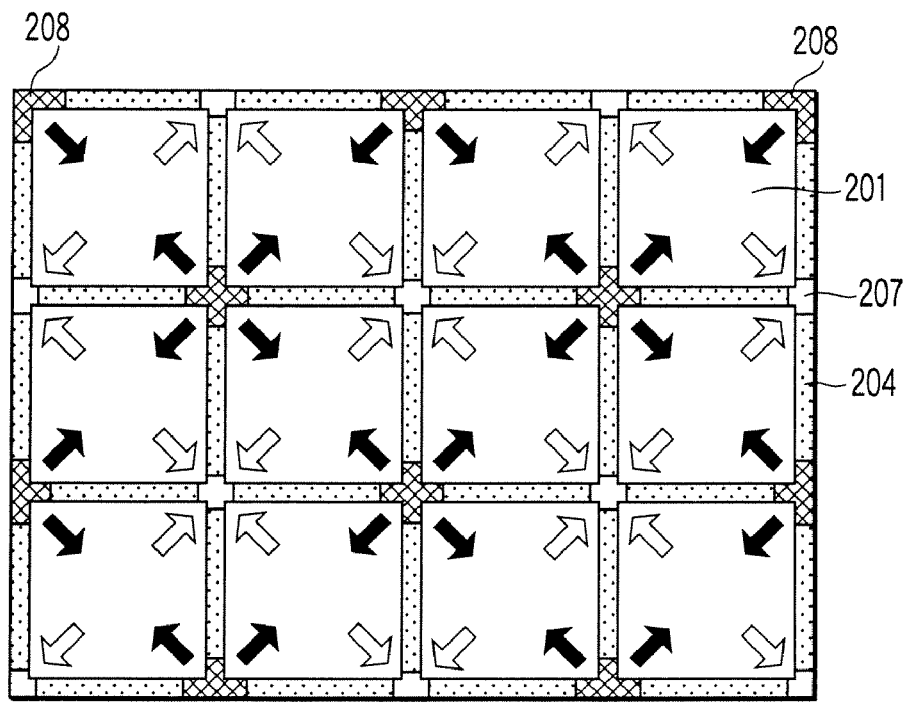
F I G. 6F

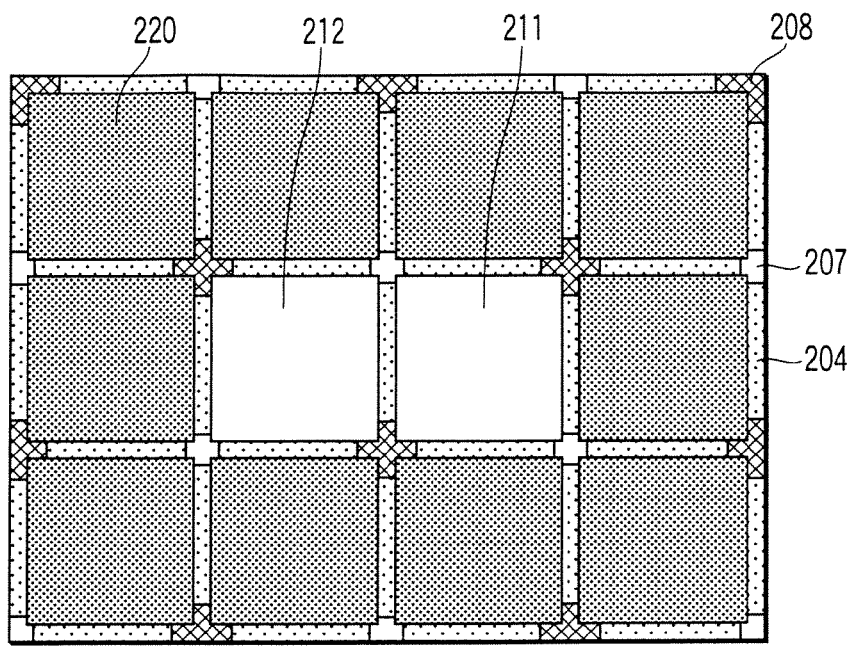
F I G. 6G
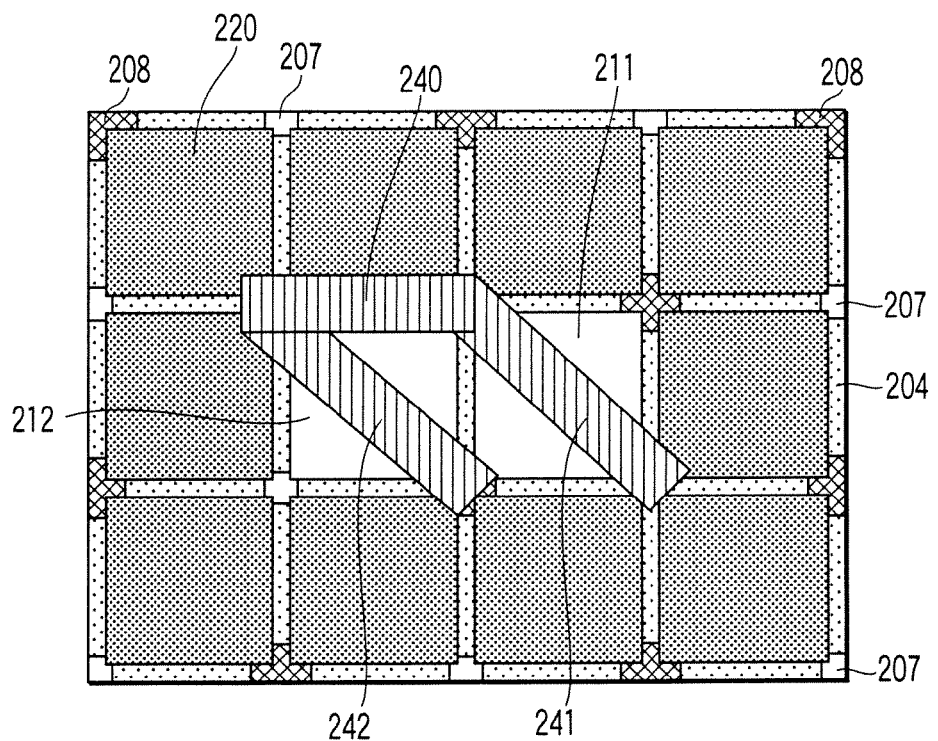
F I G. 6H

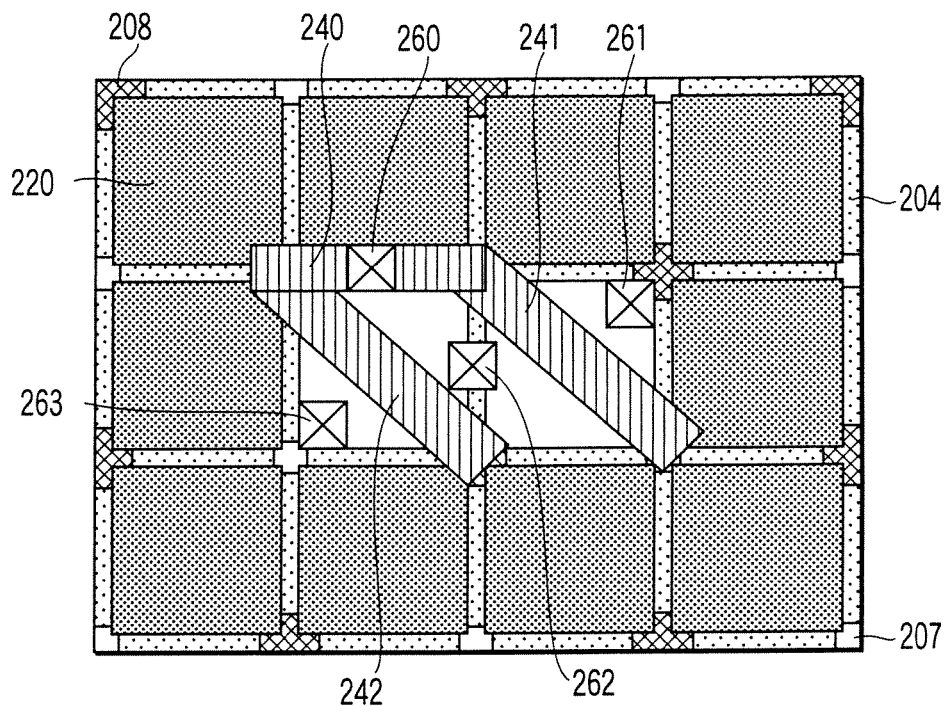
F I G. 6I
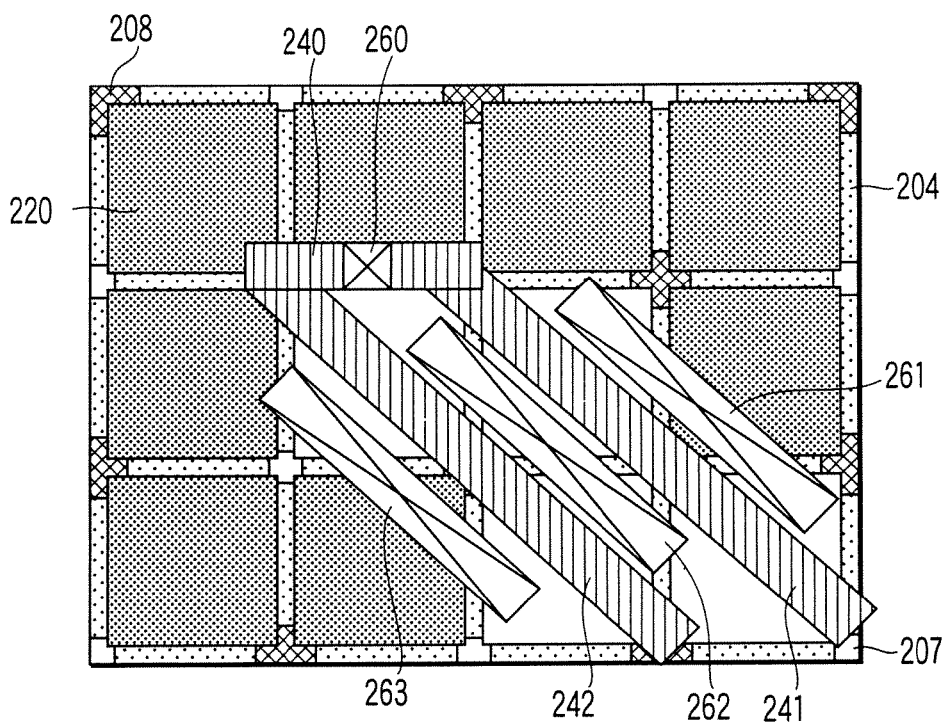
F I G. 6J

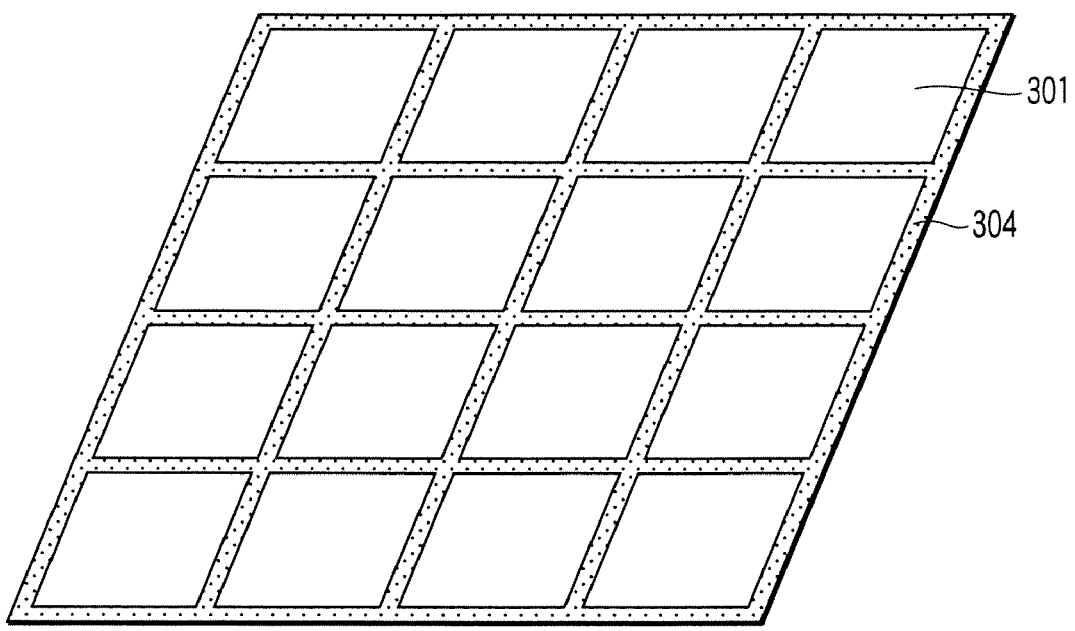
F I G. 10A
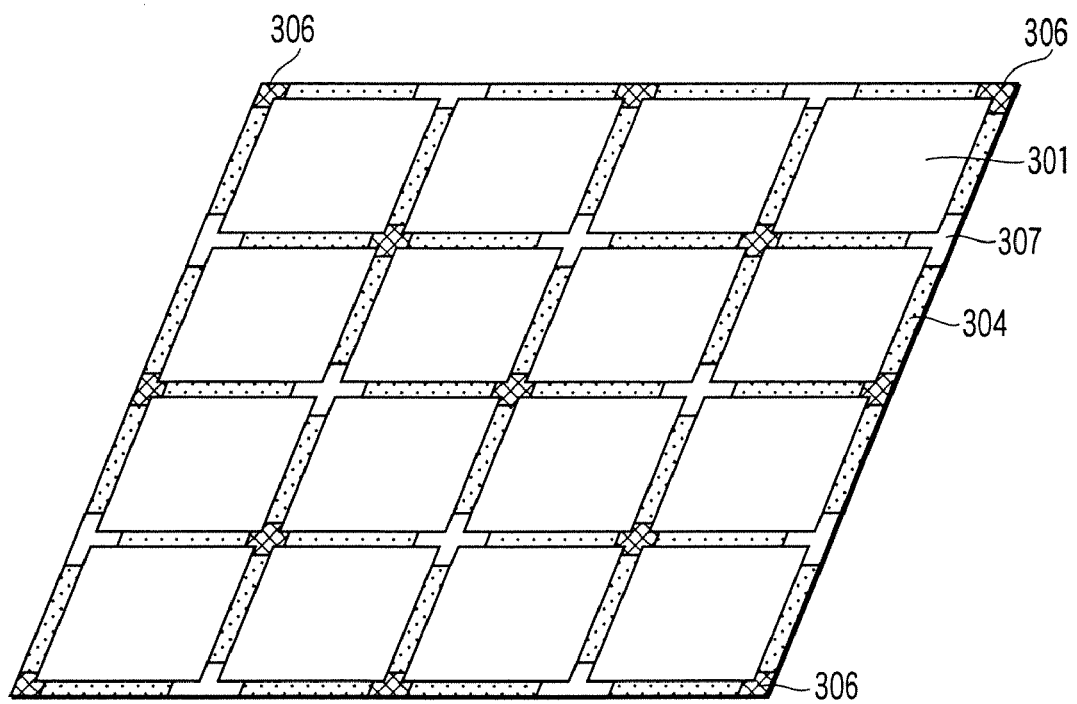
F I G. 10B

SEMICONDUCTOR DEVICE AND METHOD OF MANUFACTURE THEREOF

CROSS-REFERENCE TO RELATED APPLICATIONS

This application is based upon and claims the benefit of priority from prior Japanese Patent Application No. 2006-024883, filed Feb. 1, 2006, the entire contents of which are incorporated herein by reference.

BACKGROUND OF THE INVENTION

1. Field of the Invention

The present invention relates to a semiconductor device composed of complementary field effect transistors (MOSFETs) with increased carrier mobilities of both polarities by applying orientation-dependent mechanical stresses to their respective semiconductor channel regions and a method of manufacturing thereof.

2. Description of the Related Art

Recently, in order to increase the operation speed of MOSFETs, a method of enhancing mobilities of carriers (i.e., electrons or holes) by applying mechanical stresses to the channel-forming semiconductor portions and thereby modulating the electronic states of the conduction band and the valence band of the semiconductor has been proposed (H. Irie et al. IEDM Tech. Dig. pp. 225-228, 2004).

In order to produce such mechanical stresses in the channel regions, one can deposit an additional stress-yielding insulator film, having high internal stress, over the MOSFETs after their formation. With this method, however, most of the stress from the stress-yielding insulator would come to be applied to the gate electrodes, not to the channel regions. Thus, this method greatly suffers from its inefficiency in stress generation within the channel.

Such dissipation of stresses can be avoided by replacing a portion of each of the source and drain regions with a foreign stress-generating semiconductor substance with high internal stress other than the channel forming semiconductor (Si) (T. Ghani et al., IEDM Tech. Dig. pp. 978-980, 2003).

Compressive stress in the channel direction increases the hole mobility, whereas, tensile stress applied in the channel direction increases the electron mobility (H. Irie et al., IEDM Tech. Dig. pp. 225-228, 2004).

Thus, in order to realize a high-speed p-type MOSFET (p-MOSFET), indispensable to manufacturing of advanced complementary MOSFETs (C-MOSFETs) circuits, a portion of each of its source and drain regions must be replaced by an expansive semiconductor substance with a larger-than-silicon lattice constant (for example, a eutectic of silicon and germanium (SiGe)). Likewise, a contractile semiconductor material with a smaller-than-silicon lattice constant (for example, a eutectic of silicon and carbon (SiC)) needs to be epitaxially formed in portions of the source and drain regions to increase the speed of the n-type MOSFET (n-MOSFET).

For C-MOSFETs manufacturing, therefore, two extrinsic semiconductor materials with incompatible lattice constants have to be placed in close proximity to each other. Of course, during the epitaxial growth of one of the semiconductor materials, the adjacent region to form the other semiconductor material must be coated with an insulating layer to prevent unwanted growth of the first material. Accordingly, the completion of the C-MOSFETs naturally requires repeated steps of insulating layer deposition and extremely precise lithography as well as etching and patterning of fine structures of the insulating layer.

Besides, it is, in itself, difficult to epitaxially grow an uniform heterogeneous semiconductor material on the Si substrate in a well-controlled manner. Moreover, this unstable process step must be repeated twice for the two incompatible semiconductor materials, which results in complication of the manufacturing steps and increased manufacturing cost. In addition, an expansive semiconductor material placed in close proximity to a contractile semiconductor material results in substantial cancellation of the individual strains exerted by the semiconductor materials and, therefore, the stresses induced in the respective channels will be greatly reduced.

Furthermore, epitaxial growth of an extrinsic semiconductor material having a different lattice constant from the substrate naturally induces a large number of crystal defects at the hetero-junction between the semiconductors of the incompatible lattice constants. The dense array of the crystal defects in the vicinity of the source/drain junctions inevitably causes severe junction leakage from the source/drain regions to the substrate semiconductor below.

BRIEF SUMMARY OF THE INVENTION

According to an aspect of the present invention, there is provided a semiconductor device of complementary structure comprising:

a semiconductor region having compressive stresses in a first direction along a surface of the semiconductor region and tensile stresses in a second direction along a surface and different from the first direction;

a field effect transistor of a first conductivity type formed in the semiconductor region and including source and drain regions separately arranged along the first direction; and a field effect transistor of a second conductivity type formed in the semiconductor region and including source and drain regions separately arranged along the second direction.

BRIEF DESCRIPTION OF THE SEVERAL VIEWS OF THE DRAWING

FIGS. 1A and 1B are plan views for use in explanation of the principles of forming C-MOSFETs in accordance with the present invention;

FIGS. 2A and 2B are plan views for use in explanation of the principles of forming C-MOSFETs in accordance with the present invention;

FIG. 4 is a plan view illustrating a step of manufacture of the C-MOSFETs according to the first embodiment;

FIGS. 6A through 6J are plan views illustrating the steps of manufacturing very high speed and fine geometry C-MOSFETs according to a second embodiment;

FIGS. 10A through 10E are plan views illustrating the steps of manufacturing very high speed and fine geometry C-MOSFETs according to a third embodiment of the present invention.

DETAILED DESCRIPTION OF THE INVENTION

Figure 3A:
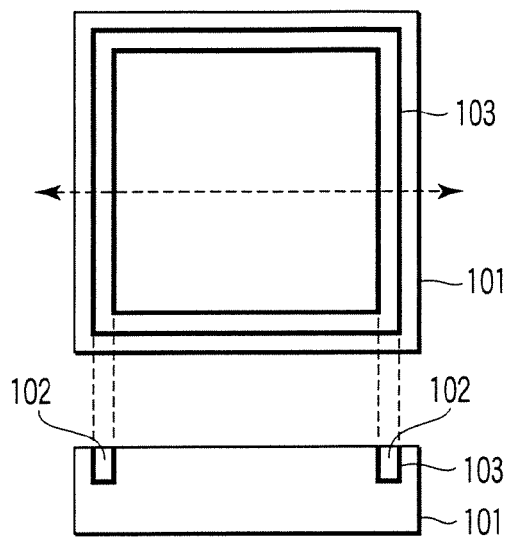
FIGS. 3A through 3H are plan and sectional views illustrating the steps of manufacturing very high speed and fine geometry C-MOSFETs according to a first embodiment.

Before describing the embodiments of the present invention, the basic principle of device formation of the present invention, in particular, C-MOSFETs fabrication is explained. The resultant C-MOSFET structure allows producing and maintaining mobility-enhancing, MOSFET-polarity-dependent stresses in the respective channels of n- and p-MOSFETs located in close proximity to each other, without inducing junction leakage and also avoiding the stress cancellation.

First, FIG. 1A shows shear strains 12-1, 12-2, 12-3 and 12-4 applied along the respective sides of the perimeter of a square semiconductor region 11. The strains are applied in such a way that the displacement vectors along the perimeter point towards a pair of the diagonal vertexes (i.e., A1 and A2. Note that each edge has a connection to either one of the above vertexes).

More precisely, along the edges connected to the vertex A1, projection of the displacement vectors onto a first diagonal line D1 between A1 and A2 are directed from A2 to A1. Likewise, along the edges connected to the vertex A2, projection of the displacement vectors onto the diagonal line D1 are directed from A1 to A2.

As a result, the semiconductor region 11 is deformed into such a (diamond) shape as indicated by broken lines 13. For the illustrative purpose, in FIG. 1A, the deformation is exaggerated over actual distortion.

Then, an enlarged view of a small (originally square-shaped) areal element 14 contained in the semiconductor region 11 is illustrated in FIG. 1B. Due to the sheer stresses applied to the perimeter of the semiconductor region 11, this interior areal element comes to be deformed into a shape as indicated by broken lines 15 in FIG. 1B. Obviously, compressive stresses 16-1 and 16-2 and tensile stresses 17-1 and 17-2 are produced simultaneously along the diagonal directions D1 and D2, respectively.

Now, it is clear that, as shown in FIG. 2A, sheer strains along the sides of the semiconductor region 11 (i.e., 12-1, 12-2, 12-3 and 12-4) generate compressive stresses 16-1 and 16-2 along the diagonal direction D1 and tensile stresses 17-1 and 17-2 along the other diagonal direction D2. That is, stresses of different polarity are produced simultaneously in the same semiconductor region 11 and the stress polarity varies with the direction.

Thus, as shown in FIG. 2B, by placing a p-MOSFET 21 in the semiconductor region 11 with its channel direction C1 being aligned to the direction D1 of compressive stress and placing an n-MOSFET 22 with its channel direction C2 being aligned to the direction D2 of tensile stress, the mobilities of both holes and electrons are increased at the same time, thanks to the compressive stresses generated in the channel of the p-MOSFET and tensile stresses induced in the channel of the n-MOSFET, allowing a high-speed operation of the resultant C-MOSFETs.

Hence, the drawbacks of the conventional techniques are resolved and high-speed C-MOSFETs are easily formed in which mobility-enhancing stresses will not dissipate nor cancel out, even if a compressive stress portion and a tensile stress portion are located in close proximity to each other. By producing stresses of both polarities depending on the channel direction, high-speed and small-dimension C-MOSFETs can be readily obtained without inducing junction leakage.

Accordingly, the above configuration offers the following advantages:

(1) By inducing a shear strain along each of the sides of the square semiconductor region 11, compressive stresses and tensile stresses can be simultaneously produced in the D1 and D2 directions, respectively. It is not required to deposit multiple semiconductor substances with different lattice constants to produce stresses of opposite polarity, thus allowing the manufacturing steps to be simplified.

(2) Since the compressive and tensile stresses are simultaneously produced in different directions, the stresses will not cancel out each other even if the p-MOSFET and the n-MOSFET are located in close proximity to each other.

(3) Because the stresses in the channel are not produced by a foreign stress-yielding semiconductor substance replacing a portion of each of the source and drain regions, junction leakage associated with the hetero-junctions between channel-forming substrate semiconductor (Si) and the source-drain-forming extrinsic semiconductor can be avoided.

Although the above principles of the invention have been described in terms of a square semiconductor region, the same principles also hold true for a rectangular semiconductor region if shear strains along its perimeter are applied in orthogonal directions. In this case, the directions in which stresses of opposite polarity are produced are a pair of orthogonal directions which are rotated by 45 degrees from the orthogonal directions of the shear strains.

In order to make the above advantages more evident, below, a brief description of C-MOSFETs equipped with heterogeneous source/drain semiconductor regions in close proximity is given so that the problems associated with the conventional techniques will be recounted and visualized clearly.

Figure 11:
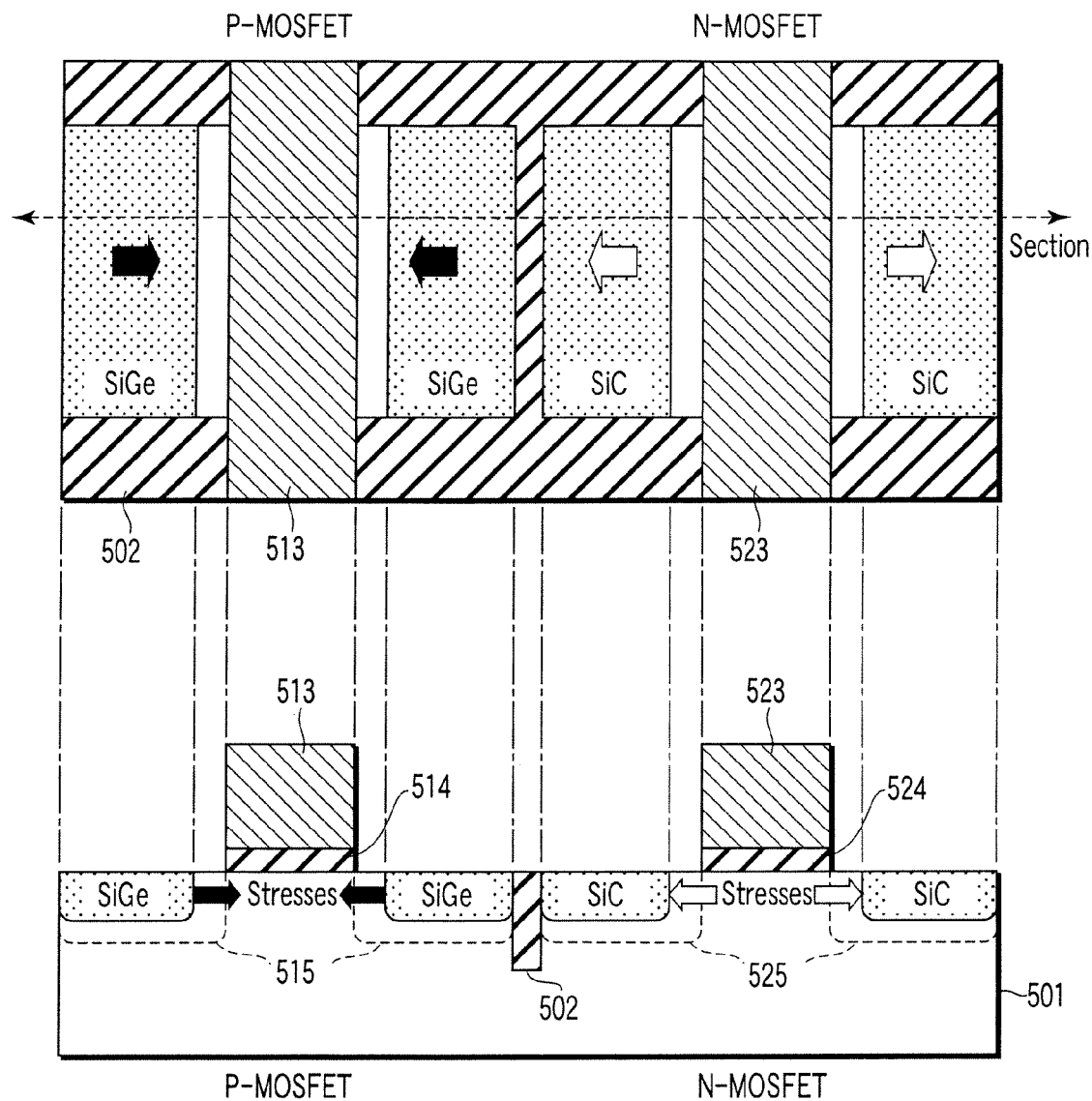
FIG. 11 is a plan and sectional view illustrating the structure of C-MOSFETs in which dissimilar semiconductor materials are selectively grown in adjacent regions.

FIG. 11 schematically shows, in plan and sectional views, C-MOSFETs in which each of the complementary MOSFETs has each of its source and drain regions formed partially of a foreign stress-yielding semiconductor material (i.e., SiGe or SiC, depending on the polarity of the constituent MOSFETs).

In FIG. 11, 501 denotes a silicon substrate, 502 a device isolation insulating film, 513 and 523 gate electrodes of the respective MOSFETs, 514 and 524 a gate insulating film, and 515 and 525 source/drain regions of the respective MOSFETs. The gate sidewalls, the contact electrodes and so on are omitted to illustrate only the basic structures of the respective MOSFETs.

For crystal growth of two extrinsic semiconductor materials (i.e., SiGe or SiC) with incompatible lattice constants to the substrate material (i.e., Si) in close proximity to each other, it is required that, during the epitaxial growth of SiC (or SiGe) on recessed source/drain regions of n-MOSFET (or p-MOSFET), the adjacent source/drain regions of p-MOSFET (or n-MOSFET) must be coated with an insulating layer to prevent unwanted growth of SiC (or SiGe) there. Formation of the finely-patterned protective film accurately covering the neighboring area demands a high-precision lithographic step. Naturally, the completion of the C-MOSFETs necessitates repeated steps of this extremely precise lithography as well as the insulating layer deposition and etching.

Furthermore, uniform and well-controlled selective epitaxial growth of heterogeneous semiconductor material is hard to obtain. Moreover, this unstable process step must be repeated twice for the two incompatible semiconductor materials, which results in complication of the manufacturing steps and increased manufacturing cost.

In addition, when a semiconductor material larger in lattice constant than Si (i.e., SiGe) and a semiconductor material smaller in lattice constant than Si (i.e., SiC) are placed in close proximity to each other, stresses exerted by these semiconductor materials cancel each other out, resulting in a reduction in stress induced in each channel. Therefore, a desired high-speed operation cannot be achieved.

Of course, epitaxial growth of an extrinsic semiconductor material (i.e., SiGe or SiC) having a different lattice constant from the substrate material naturally induces a large number of crystal defects at the hetero-junction between the semiconductors of the incompatible lattice constants. The dense array of the crystal defects in the vicinity of the source/drain junctions inevitably causes severe junction leakage from the source/drain regions to the substrate semiconductor below.

To suppress the junction leakage, the hetero-junctions must be completely contained within the source/drain diffusion regions by incorporating conductive impurities beyond the hetero-junctions, so that deeper source/drain pn-junctions 515 and 525 envelop the hetero-junctions, electrically isolating them from the substrate.

However, the diffusion of conductive impurities introduced in the vicinity of the hetero-junctions could be unexpectedly and uncontrollably enhanced due to crystal defects present nearby (this phenomenon is known as transient enhanced diffusion). As a result, the pn junctions will be formed much deeper than the intended depth around the defective regions in the substrate. In addition, it is known that conductive impurities, such as arsenic (As), diffuse through SiGe at high speed. The rapid diffusion results in yet deeper pn junctions in the substrate.

Deep source and drain regions of small-sized MOSFETs allow the distortion of an electric field at each of the source and drain electrodes to reach the center of the channel. Thus, lowering of the threshold voltage with reduction of the channel length (i.e., the short channel effect) becomes prominent. If devices come to have threshold voltages different from the one intended at circuit design, malfunctioning or complete impairment of the entire circuit would result. Furthermore, since the threshold voltage comes to strongly depend on the physical length (i.e., processed dimensions) of the gate electrode, even a slight deviation or fluctuation in processing steps makes it impossible to obtain uniform and reproducible devices of desired characteristics.

The present invention provides a way to solve such problems as described above. Hereinafter, the embodiments of the present invention will be described with reference to the accompanying drawings.

First Embodiment

FIGS. 3A through 3H are plan views, in the order of manufacturing steps of a semiconductor device according to a first embodiment of the present invention and cross-sectional views taken along broken lines in the corresponding plan views. FIG. 4 is a plan view illustrating a very high speed and small dimension C-MOSFETs at a step of manufacturing in accordance with the first embodiment.

This embodiment provides a straightforward method of manufacturing very high speed and fine geometry C-MOSFETs by effectively producing channel stresses of both polarities depending on the types of the MOSFETs, without junction leakage and stress cancellation.

First, as shown in FIG. 3A, on a silicon substrate (semiconductor substrate) 101, a groove 102 is formed by means of known techniques such as lithography and anisotropic etching (RIE). The moat-shaped groove defines a square interior region where C-MOSFETs are to be formed. Then, an insulating film 103 is formed on the bottom and sidewalls of the groove 102, making use of conventional techniques, for example, thermal oxidation.

Figure 3B:
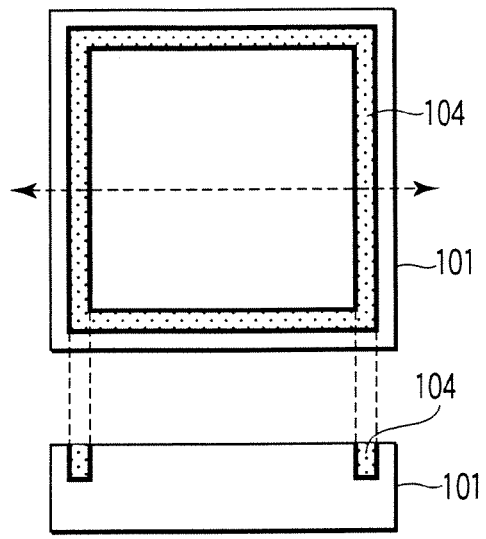

Next, as shown in FIG. 3B, the groove 102 is filled with, for example, silicon nitride (first substance) 104 using conventional techniques, such as chemical vapor deposition (CVD) and chemical mechanical polishing (CMP).

Figure 3C:
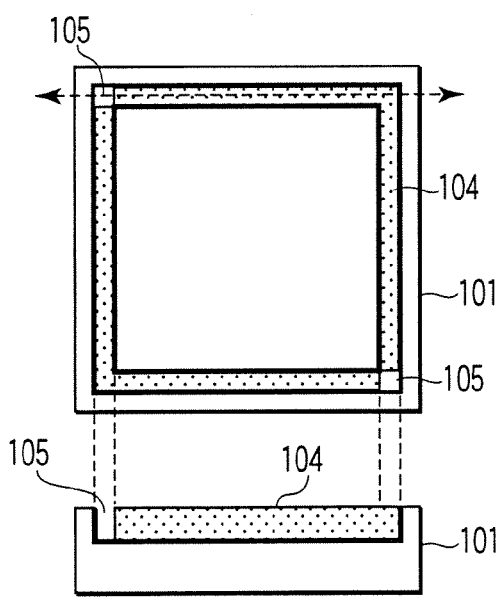

Next, as shown in FIG. 3C, the silicon nitride 104 in a pair of diagonally opposite corners of the groove 102 is removed by means of known techniques such as lithography and anisotropic etching (RIE).

Figure 3D:
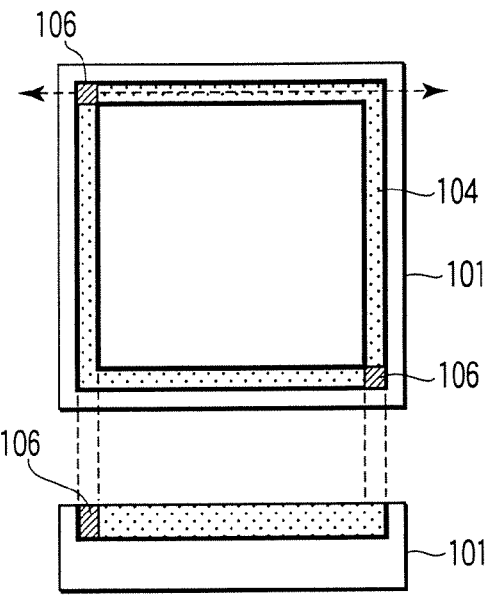

Next, as shown in FIG. 3D, a material that can readily expand in volume during oxidation, for example, amorphous SiGe 106 with 50% (atomic) Ge concentration (second substance), is formed using CVD in the portions from which the silicon nitride has been removed. The deposition of amorphous SiGe can be easily achieved using $SiH_4$ and $GeH_4$ gases under the conditions of, say, 300 Torr ($4 \times 10^4$ Pa) and 500° C. The SiGe layer formed over the silicon substrate 101 is then removed by means of CMP to thereby leave the SiGe 106 only in the diagonally opposite corners 105.

Figure 3E:
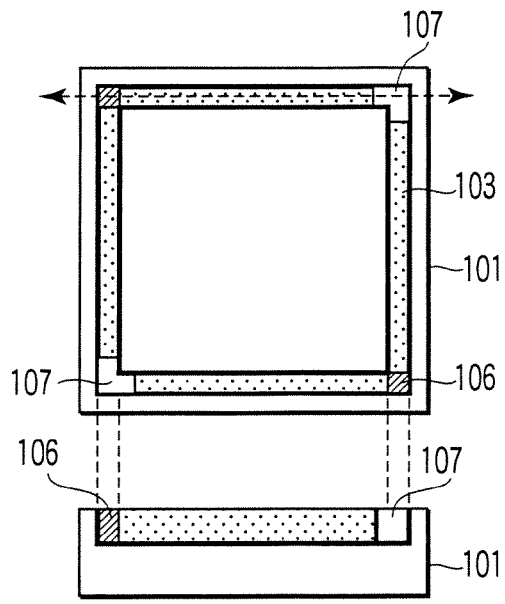

Next, as shown in FIG. 3E, the silicon nitride layer 104 in the other pair of diagonally opposite corners 107 is removed by means of lithography and RIE. Thereby, the two opposite corners of the device-forming region are completely exposed.

Figure 3F:
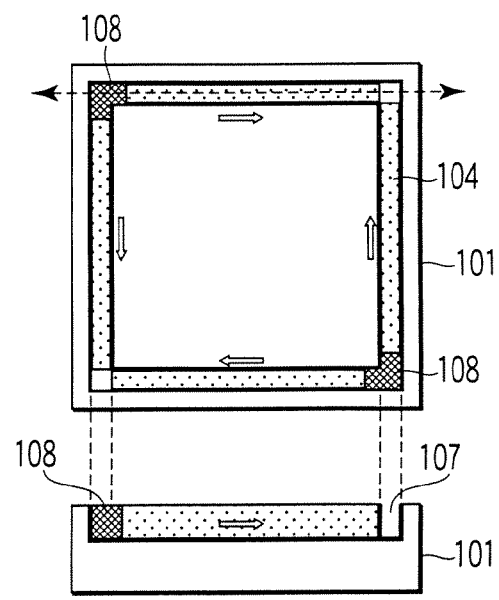

Next, as shown in FIG. 3F, thermal oxidation is carried out. Since oxidation of SiGe proceeds much faster than that of Si, SiGe layer 106 can be selectively oxidized to form oxidized SiGe layer 108 while maintaining Si substrate virtually intact. The SiGe layer 106 expands on oxidation. Thus, thanks to the holes at the opposite corners 107 of silicon nitride layer 104, the nitride layer can be readily displaced towards the directions indicated by white arrows in FIG. 3F. Because silicon nitride is a hard material (i.e., having larger elastic constants than Si), the layer 104 itself hardly deforms. Therefore, the volumetric expansion of the SiGe layer 106 and associated displacement of the nitride layer can effectively induce sheer strains of the silicon substrate 101 along the edges indicated by white arrows in FIG. 3F.

According to the principles described in FIGS. 1 and 2, compressive stress and tensile stress are produced along the diagonal line connecting the opposite corners 105 with the oxidized SiGe layer 108 and the diagonal line connecting the opposite corners 107 emptied of the silicon nitride layer 104, respectively.

It should be noted here that, to produce stresses of opposite polarity, it is not required to deposit multiple stress-yielding semiconductor materials of different lattice constants and, hence, the manufacturing steps can be simplified.

In addition, deformation of the silicon substrate by compression in one direction and tension in other direction is much easier (i.e., done by with weaker forces) than that by compression or tension in only one direction alone.

Figure 3G:
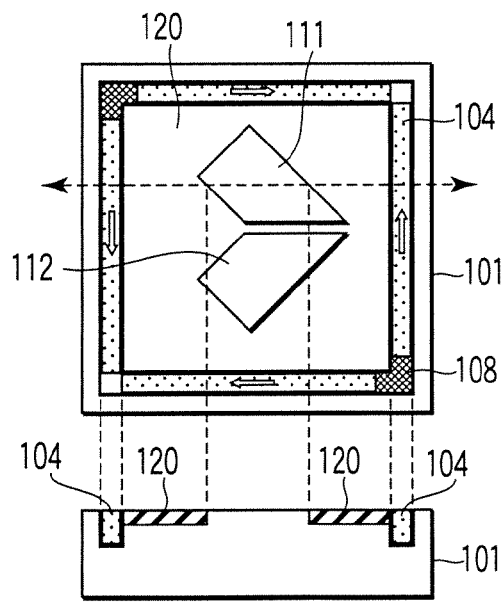

Next, as shown in FIG. 3G, the surface of the silicon substrate 101 surrounding the p-MOSFET and n-MOSFET device regions 111 and 112 is etched down by means of standard techniques, such as lithography and RIE, to form a shallow recess. The recess is then filled up with an insulating material 120 of, say, silicon oxide, making use of standard techniques, such as CVD and CMP, to thereby form a device isolation region. Subsequently, n-type and p-type impurities are introduced in the p-MOSFET and n-type device regions 111 and 112, respectively, by, for example, ion implantation. Then, they are activated by thermal annealing.

Figure 3H:
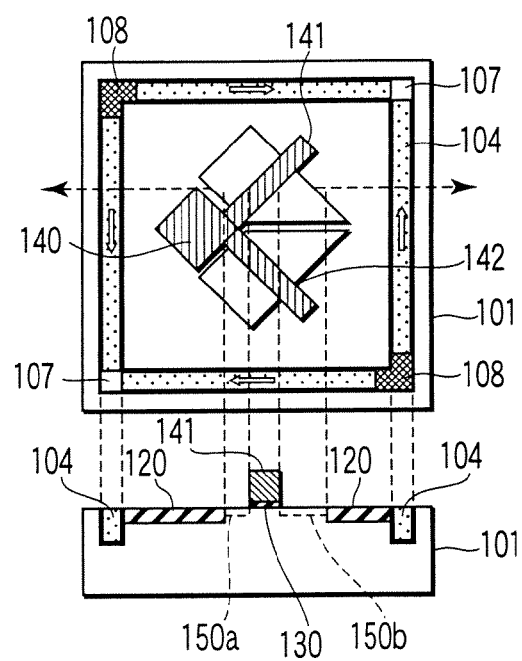

Next, as shown in FIG. 3H, a gate insulating film 120 and polysilicon portions 140, 141 and 142 serving as gate electrodes are formed by means of standard techniques, such as thermal oxidation, CVD, RIE, etc. Here, the gate electrode 141 of the p-MOSFET is aligned so that it runs perpendicular to the line connecting the diagonal corners filled with oxidized SiGe layer 108 (i.e., the channel direction of the p-MOSFET being parallel to the above diagonal line). On the other hand, the gate electrode 142 of the n-MOSFET is placed perpendicularly to the other diagonal line connecting the opposing corners 107 (i.e., the channel direction of the n-MOSFET being parallel to the other diagonal line). Thereby, compressive stress is produced along the channel of the p-MOSFET, whereas tensile stress is induced along the channel of the n-MOSFET. As a result, the mobilities of holes (for p-MOSFET) and electrons (for n-MOSFET) increase.

Then, p-type impurities are ion implanted into the p-MOSFET device region 111 using the gate electrode 141 as part of a mask and activated through thermal treatment, thereby forming source and drain diffusion layers 150a and 150b of the p-MOSFET. Source and drain regions are likewise formed in the n-MOSFET device region 112 as well.

In this manner, high-drive p- and n-MOSFETs, due to enhanced mobilities, can be formed at the same time.

Note here that the present embodiment does not require a foreign stress-yielding semiconductor substance replacing a portion of each of the source and drain regions. Absence of hetero-junctions between channel-forming Si and the source-drain-forming extrinsic semiconductor ensures leakage-free source/drain electrodes for the resulting MOSFET.

Moreover, the compressive and tensile stresses are simultaneously produced in different directions; thus, even if the p- and n-MOSFETs are placed in close proximity to each other, the stresses will not cancel out.

After formation of gate sidewalls, incorporation of conductive impurities for deeper source and drain formation, the silicidation of their surfaces, and the deposition of interlayer insulating films are carried out by means of standard techniques.

Furthermore, contact holes 160, 161, 162 and 163 are drilled through the interlayer insulating films (not shown) in such a configuration as shown in FIG. 4 with respect to the underlying p- and n-MOSFETs.

Subsequently, the contact holes are filled with metal substance and then metallic interconnection, packaging, and so on are carried out to finish a C-MOSFET inverter circuit.

Although the embodiment has been described in terms of a single C-MOSFET inverter circuit, the principles of the invention are also applicable to a plurality of C-MOSFET inverter circuits. In addition, the principles of the invention is also applicable to a semiconductor circuit comprised of MOSFETs of single polarity which are arranged in the optimum direction in a semiconductor region.

Figure 5A:
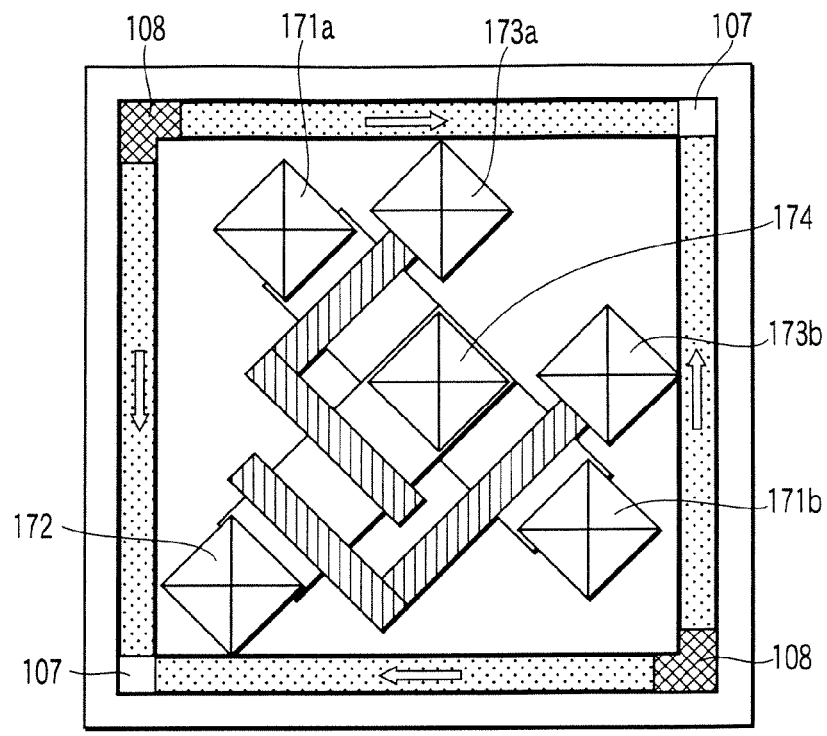
FIGS. 5A and 5B are plan views illustrating modifications of the first embodiment.
Figure 5B:
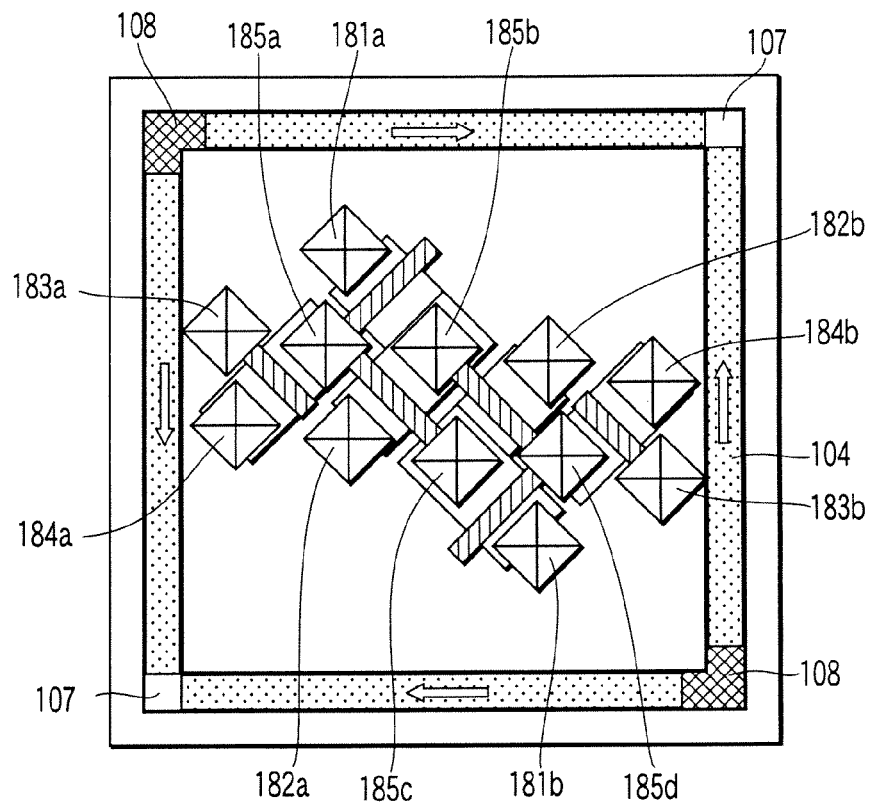

In addition, besides a C-MOSFET inverter circuit, two or more C-MOSFETs can be formed as shown in FIGS. 5A and 5B. FIG. 5A shows an example of a NAND circuit and FIG. 5B shows an example of an SRAM circuit. Further, to increase the integration density, C-MOSFETs of different function can be also placed in the device isolation regions shown in the diagrams.

In FIG. 5A, 171a and 171b denote power supply contact holes, 172 a ground contact hole, 173a and 173b input contact holes, and 174 an output contact hole.

In FIG. 5B, 181a and 181b denote power supply contact holes, 182a and 182b ground contact holes, 183a and 183b word line contact holes, 184a and 184b bit line contact holes, and 185a, 185b, 185c and 185d contact holes for electrical connections.

The device components and their arrangement are not limited to those illustrated in this embodiment.

For example, in this embodiment, a silicon nitride layer is buried around the device formation region. However, this may be replaced with a hard and heat resistant substance, such as TiN.

The substance for volumetric expansion is not also limited to SiGe. With a proper anti-oxidation film, thermal oxidation of Si itself could be utilized. Otherwise, volumetric expansion induced by silicidation (i.e., reaction of Si with a metal), for example, formation of NiSi, CoSi, or PtSi, can also be of use.

Instead of the volumetric expansion, volumetric contraction due to, such as, formation of $CoSi_2$ or $NiSi_2$ can be exploited for stress generation as well. With simple 90-degree rotation, the present embodiment also applies to the case of the volumetric contraction as is. Further, a material that causes volumetric expansion and a material that causes volumetric contraction can be unitized in tandem, replacing SiGe and cavities in this embodiment, respectively.

Although, in this embodiment, shear stresses are produced prior to the formation of C-MOSFETs, they may be generated after the formation of C-MOSFETs, when a volume changing reaction at low temperatures, such as silicidation, is available. Posterior stress generation can avoid a high-temperature heat treatment, which may otherwise cause relaxation of pre-generated stresses.

Furthermore, an SOI substrate may be employed as the silicon substrate. It is also possible to further adjust the stresses in the channels by additionally depositing an insulating film with internal stress over the C-MOSFETs that are already formed.

Second Embodiment

FIGS. 6A through 6J are plan views, in the order of manufacturing steps of a semiconductor device according to a second embodiment of the present invention.

The second embodiment provides a straightforward method of manufacturing very high speed and fine geometry C-MOSFETs in which a plurality of semiconductor regions different in the directional dependence of mechanical stress is formed on a semiconductor substrate. Channel stresses of both polarities are effectively produced depending on the types of the MOSFETs arranged in close proximity, without junction leakage and stress cancellation.

Figure 6A:
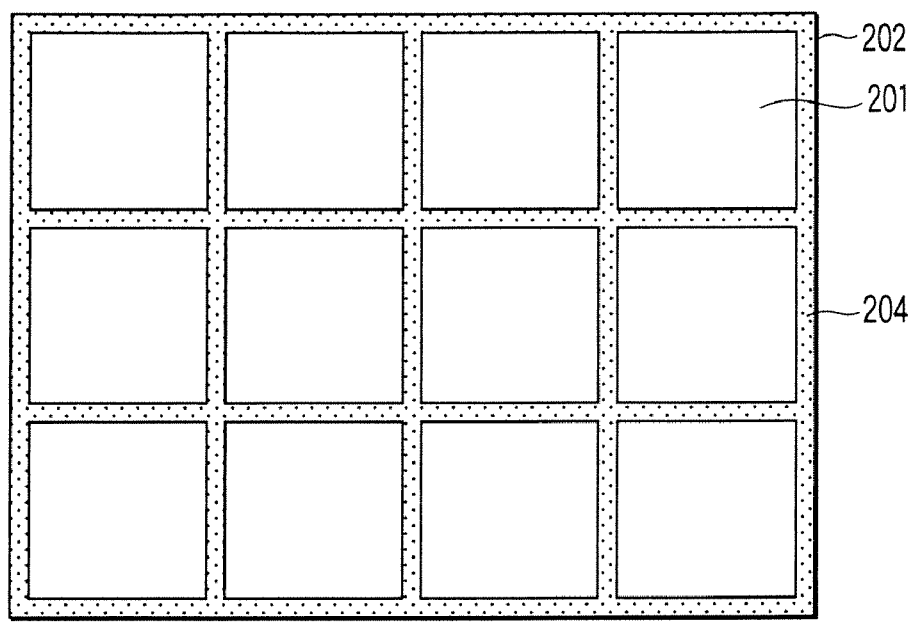

A plurality of device formation regions 201 on a silicon substrate is subjected to the steps shown in FIGS. 3A and 3B in the first embodiment to obtain such a planar structure as shown in FIG. 6A. That is, device formation regions 201 each of a square shape are arranged in a matrix form. Grooves 202 are formed between the device formation regions 201. These grooves are filled with a silicon nitride layer 204.

The cross-sectional view of each device formation region remains unchanged from that of the C-MOSFET formation region in the first embodiment. The cross-sectional views in subsequent steps are also the same as those in the corresponding steps in the first embodiment. Since the cross-sectional structures in the subsequent steps will therefore be easily understood by referring to the cross-sectional views in the first embodiment, thus, the cross-sectional views in the second embodiment are omitted.

Figure 6B:
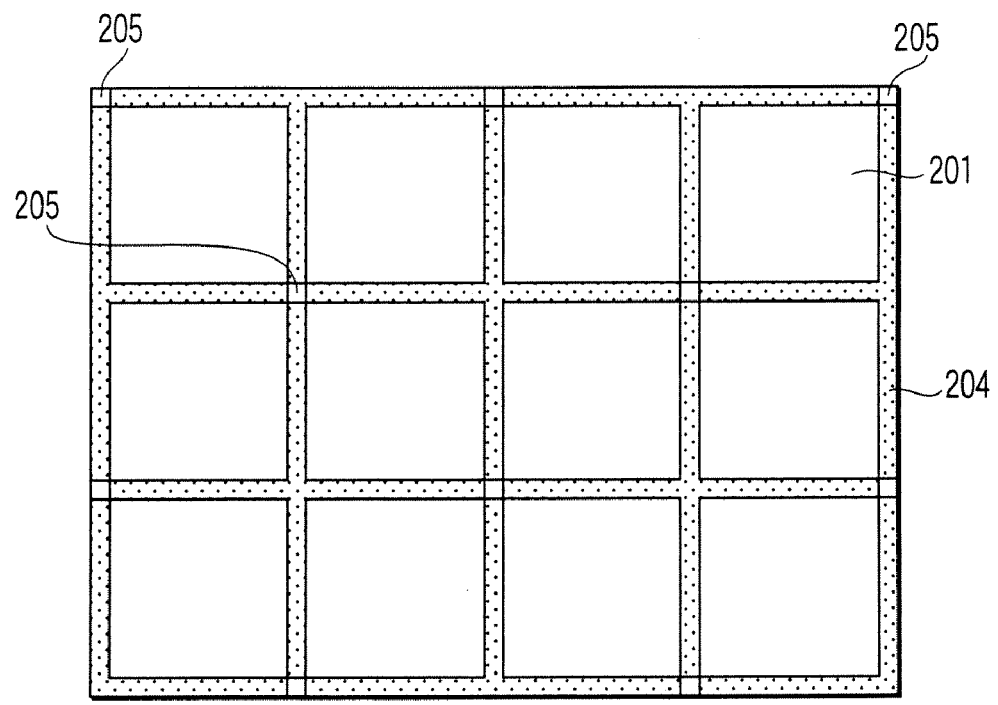

Next, as shown in FIG. 6B, the silicon nitride layer 204 buried in a first pair of diagonally opposite corners 205 of each of the device formation regions 201 is removed by lithography and RIE as in the case of FIG. 3C in the first embodiment. The diagonal direction of the first opposing corners is arranged in an alternating manner between horizontally and vertically neighboring device formation regions.

Next, as shown in FIG. 6C, the first pairs of opposing corners 205 are filled with an amorphous SiGe layer 206 containing, say, Ge at 50% (atomic) concentration as in the case of FIG. 3E in the first embodiment.

Next, as shown in FIG. 6D, the silicon nitride layer 204 in a second pair of the other diagonally opposing corners 207 of each of the device formation regions is removed as in the case of FIG. 3E in the first embodiment, thereby completely exposing the second pairs of opposing corners 205 in each device formation region.

Next, as shown in FIG. 6E, thermal oxidation is carried out as in the case of FIG. 3F. Since the speed of oxidation of the SiGe layer 206 is very high in comparison with Si, the oxidation mainly proceeds in the buried SiGe layer to form oxidized SiGe layer 208. The SiGe layer 206 expands on oxidation. Thanks to the holes at the opposite corners 207 of silicon nitride layer 204, the nitride layer can be readily displaced towards the directions indicated by white arrows in FIG. 6E, producing sheer strains in each device formation region 201 along the directions also indicated by the white arrows.

Therefore, as shown in FIG. 6F, in accordance with the principles described in FIGS. 1 and 2, in each of the device formation regions 201, compressive stress is produced along the diagonal direction of the first opposing corners with the oxidized SiGe layer 208. At the same time, tensile stress is produced along the diagonal direction of the second opposing corners 207 emptied of the silicon nitride layer 204.

It should be noted here that, to produce stresses of opposite polarity, it is not required to deposit multiple stress-yielding semiconductor materials of different lattice constants and, hence, the manufacturing steps can be simplified.

In addition, deformation of the silicon substrate by compression in one direction and tension in other direction is much easier (i.e., done by with weaker forces) than that by compression or tension in only one direction alone.

Furthermore, the directions of compression and tension are alternating between neighboring device formation regions; thus, the global deformation of the entire semiconductor substrate will be prevented. Therefore, the mechanical strength of the semiconductor substrate is retained and the semiconductor wafer can be handled safely and stably during the manufacturing steps.

Next, as shown in FIG. 6G, the surface of each device formation region 201 surrounding p- and n-MOSFET device regions 211 and 212 is etched down by means of standard techniques to form a shallow recess. The recesses are then filled up with an insulating material 220 of, say, silicon oxide, making use of CVD and CMP to form device isolation regions. Subsequently, n-type and p-type impurities are introduced in the p-MOSFET and n-type device regions 211 and 212, respectively, by ion implantation and then activated by thermal annealing.

Next, as shown in FIG. 6H, a gate insulating film and polysilicon gate electrodes 240, 241 and 242 are formed by means of standard techniques, such as thermal nitridation, CVD, RIE, etc. Here, the gate electrode 241 of the p-MOSFET is aligned so that it runs perpendicular to the diagonal direction connecting the first opposing corners filled with the oxidized SiGe layer 208. On the other hand, the gate electrode 242 of the n-MOSFET is placed perpendicularly to the diagonal direction connecting the second opposing corners 207 devoid of the silicon nitride layer.

In the present embodiment, alteration of the stress directions by 90 degrees between the adjacent p- and n-MOSFET device regions 211 and 212 allows parallel gate electrodes of the n- and p-MOSFETs. Even if the gate electrodes are placed parallel to each other, compressive stress is rightly produced along the channel of the p-MOSFET and, at the same time, tensile stress is duly induced along the channel of the n-MOSFET. As a result, the mobilities of holes (for p-MOSFET) and electrons (for n-MOSFET) increase.

Then, p-type impurities are ion implanted into the p-MOSFET device region 211 using the gate electrode 241 as part of a mask and activated through thermal treatment, thereby forming the source and drain diffusion layers of the p-MOSFET. Likewise, the source and drain regions of the n-MOSFET are formed using the gate electrode 242 as part of a mask.

Note here that the present embodiment does not require a foreign stress-yielding semiconductor substance replacing a portion of each of the source and drain regions. Absence of hetero-junctions between channel-forming Si and the source-drain-forming extrinsic semiconductor ensures leakage-free source/drain electrodes for the resulting MOSFET.

In addition, by dividing a semiconductor substrate into a plurality of alternately strained regions, a number of possible device arrangements for mobility enhancement increases, thus providing greater latitude in circuit layout.

Furthermore, it should be noted here that the buried silicon nitride layer 204 also serves for device isolation between p- and n-MOSFETs which are adjacent to each other.

Of course, since compressive and tensile stresses are simultaneously produced in different directions, they will not cancel each other out even if the MOSFETs are placed in proximity to each other.

In this manner, high-drive p- and n-MOSFETs, due to enhanced mobilities, can be formed at the same time.

After formation of gate sidewalls, incorporation of conductive impurities for deeper source and drain formation, the silicidation of their surfaces, and the deposition of interlayer insulating films are carried out by means of standard techniques.

Furthermore, contact holes 260, 261, 262 and 263 are drilled through the interlayer insulating films (not shown) in such a configuration as shown in FIG. 6I with respect to the underlying p- and n-MOSFETs.

Subsequently, the contact holes are filled with metal substance and then metallic interconnection, packaging, and so on are carried out to finish a C-MOSFET inverter circuit.

Although, in this embodiment, one functional MOSFET is formed within a single segmental device formation region, it may be formed across two or more segmental device formation regions as shown in FIG. 6J. Thanks to the alternately arranged stress directions, when a MOSFET is formed over two or more segmental device formation regions, the gate electrode can be extended straightly to a diagonally adjacent segmental device formation region as shown in this figure. In this manner, a MOSFET with high drivability (i.e., a wide MOSFET) can be formed freely and concurrently with smaller and narrower MOSFETs.

Of course the gate electrode can be extended into a horizontally or vertically adjacent segmental device formation region by angling squarely at the border between the neighboring segments.

Evidently, formation of MOSFETs over two or more segmental regions allows yet greater latitude in the layout of a semiconductor circuit.

Although the embodiment has been described in terms of a single C-MOS inverter circuit, the principles of the invention is also applicable to two or more C-MOSFET inverter circuits.

Figure 7A:
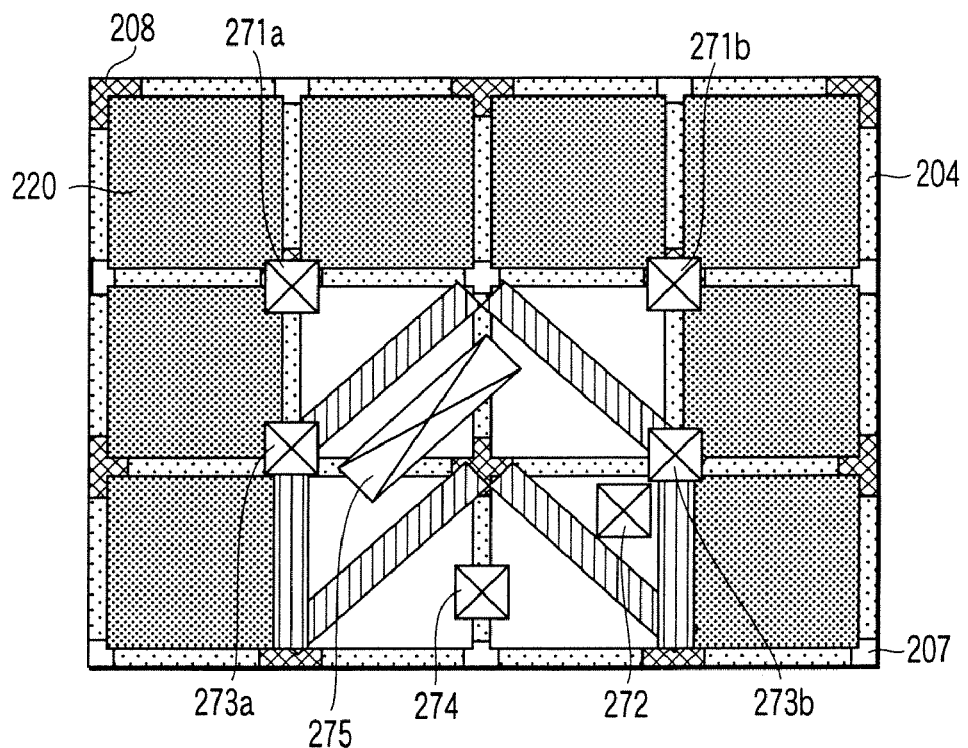
FIGS. 7A and 7B are plan views illustrating modifications of the second embodiment.
Figure 7B:
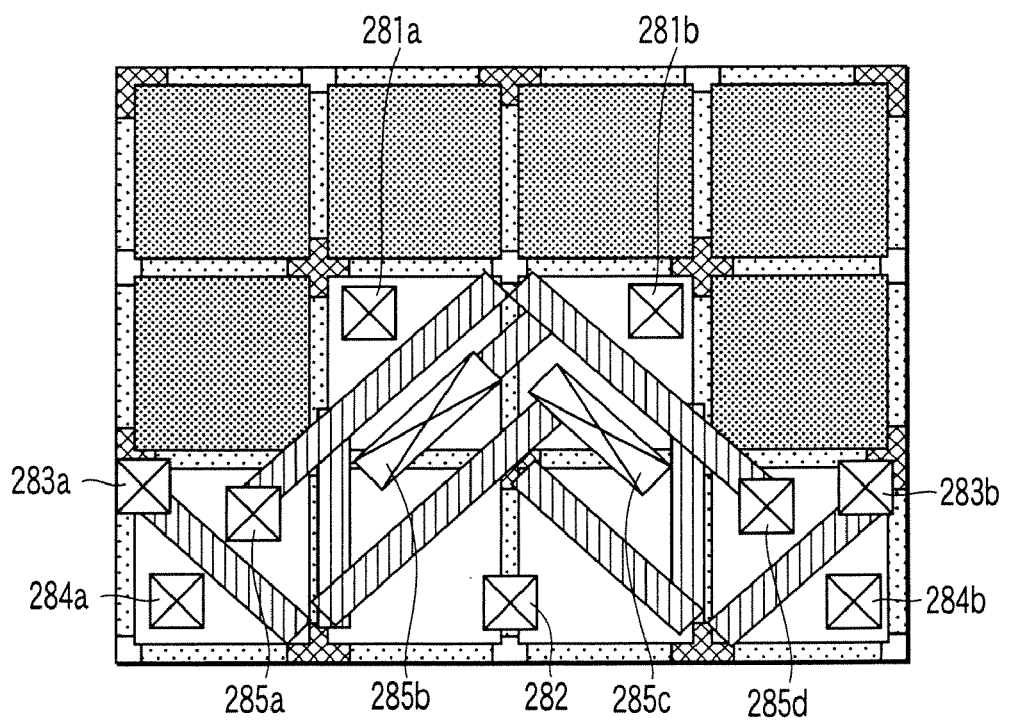

In addition, two or more C-MOSFETs can be formed as shown in FIGS. 7A and 7B. FIG. 7A shows an example of a NAND circuit and FIG. 7B shows an example of an SRAM circuit. Additional C-MOSFETs can be placed in the device isolation regions shown in the diagrams to further increase the integration density.

In FIG. 7A, 271*a* and 271*b* denote power supply contact holes, 272 a ground contact hole, 273*a* and 273*b* input contact holes, and 274 a contact hole for electrical connection. In FIG. 7B, 281*a* and 281*b* denote power supply contact holes, 282 a ground contact hole, 283*a* and 283*b* word line contact holes, 284*a* and 284*b* bit line contact holes, and 285*a*, 285*b*, 285*c* and 285*d* contact holes for electrical connections.

The device components and their arrangement are not restricted to those illustrated in this embodiment.

For example, in this embodiment, a silicon nitride layer is buried around the device formation region. However, this may be replaced with a hard and heat resistant substance, such as TiN.

The substance for volumetric expansion is not also limited to SiGe. With a proper anti-oxidation film, thermal oxidation of Si itself could be utilized. Otherwise, volumetric expansion induced by silicidation (i.e., reaction of Si with a metal), for example, formation of NiSi, CoSi, or PtSi, can also be of use.

Instead of the volumetric expansion, volumetric contraction due to, such as, formation of $CoSi_2$ or $NiSi_2$ can be exploited for stress generation as well. With simple 90-degree rotation, the present embodiment also applies to the case of the volumetric contraction as is. Further, a material that causes volumetric expansion and a material that causes volumetric contraction can be unitized in tandem, replacing SiGe and cavities in this embodiment, respectively.

Although, in this embodiment, shear stresses are produced prior to the formation of C-MOSFETs, they may be generated after the formation of C-MOSFETs, when a volume changing reaction at low temperatures, such as silicidation, is available. Posterior stress generation can avoid a high-temperature heat treatment, which may otherwise cause relaxation of pre-generated stresses.

Furthermore, an SOI substrate may be employed as the silicon substrate. It is also possible to further adjust the stresses in the channels by additionally depositing an insulating film with internal stress over the C-MOSFETs that are already formed.

Third Embodiment

FIGS. 8, 9 and 10A through 10E are diagrams to explain a semiconductor device according to a third embodiment of the present invention.

Figure 8:
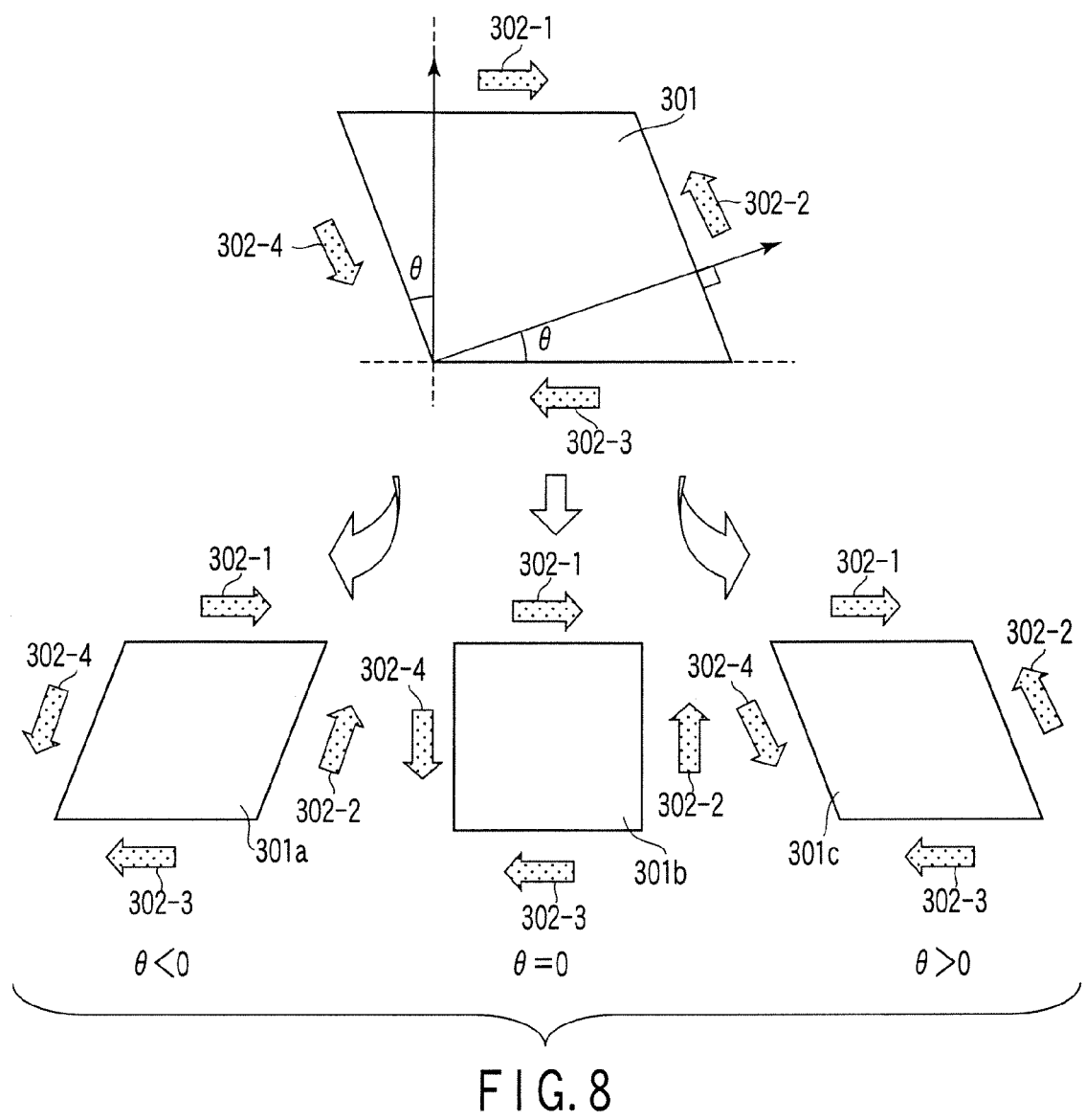
FIG. 8 is a diagram for use in explanation of compressive and tensile stresses produced when a parallelogram-shaped semiconductor region is subjected to shear stresses.
Figure 9:
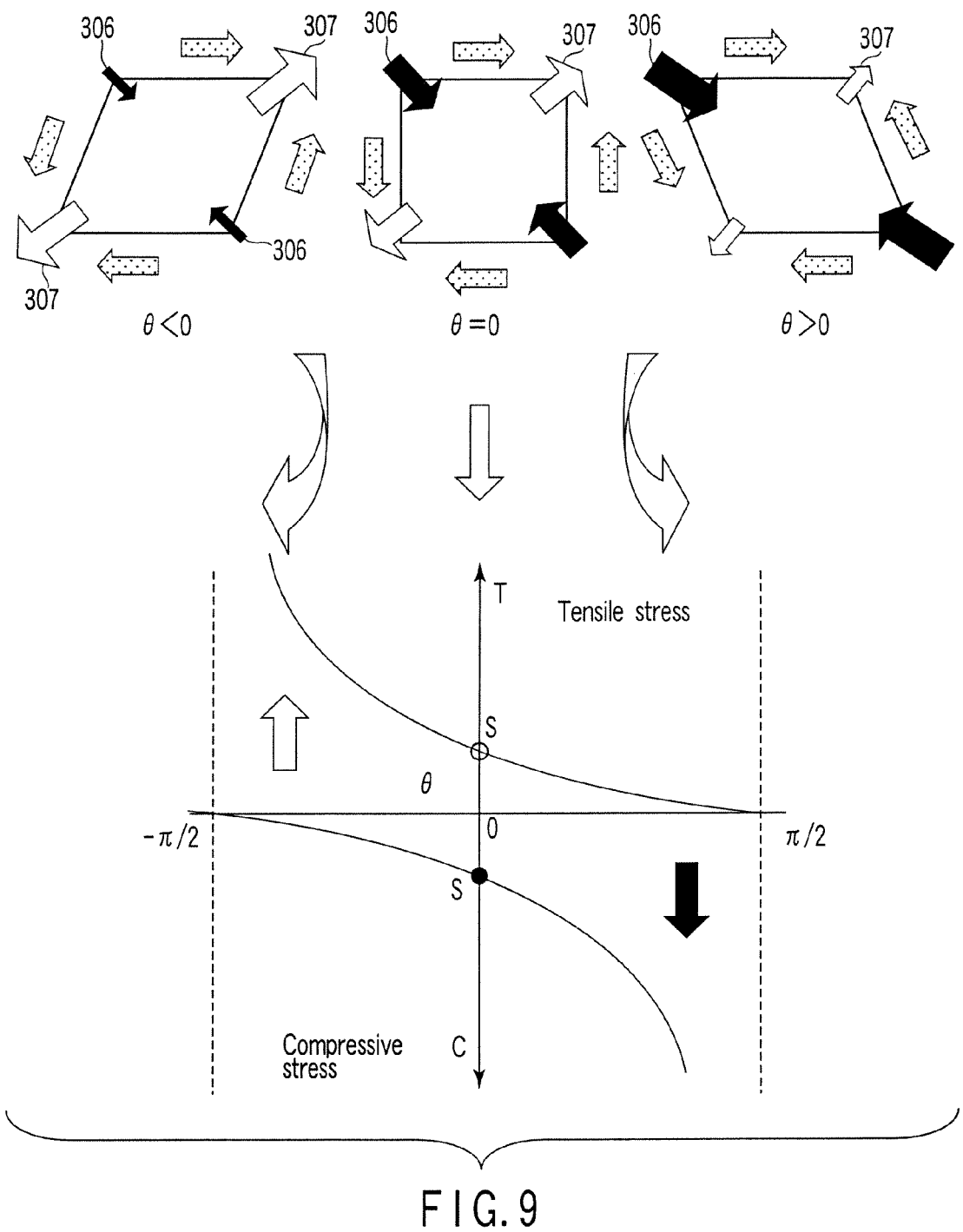
FIG. 9 is a characteristic diagram for use in explanation of compressive and tensile stresses produced when a parallelogram-shaped semiconductor region is subjected to shear stresses.

More specifically, FIGS. 8 and 9 are plan views to explain compressive and tensile stresses produced when a parallelogram-shaped semiconductor region is subjected to shear stresses.

FIGS. 10A through 10E are plan views, in the order of manufacturing steps of a semiconductor device according to a third embodiment of the present invention.

This embodiment provides a method of forming a parallelogram-shaped semiconductor region in which one of the compressive or tensile stress is dominant over the other tensile or compressive stress.

Like the second embodiment, the third embodiment demonstrates a straightforward method of manufacturing very high speed and fine geometry C-MOSFETs in which channel stresses of both polarities are effectively produced depending on the types of the MOSFETs arranged in close proximity, without junction leakage and stress cancellation.

In the embodiments described so far, compressive and tensile stresses are simultaneously produced in a square semiconductor region by inducing shear strains. In this embodiment, a parallelogram-shaped semiconductor region is subjected to shear strains. Stress modulation associated with the shape change of the semiconductor region is exploited.

First, the discussion about stresses produced in a square-shaped semiconductor region described in conjunction with FIGS. 1A, 1B, 2A and 2B is generalized to stresses produced in a parallelogram-shaped semiconductor region when it is subjected to shear strains.

Now, consider a general case where, as shown in the upper portion of FIG. 8, shear strains 302-1, 302-2, 302-3 and 302-4, indicated by arrows, are applied to a semiconductor region 301 in the shape of a common parallelogram (e.g., a diamond), with its inclination angle θ (radians) taken as a parameter. It should be noted that, depending on θ, the shape of the parallelogram 301 ranges from 301*a* (θ<0), through 301*b* (θ=0; square), to 301*b* (θ>0) as shown in the lower portion of FIG. 8.

When each of these parallelogram-shaped semiconductor regions is subjected to shear stresses shown in FIG. 8, compressive and tensile stresses of both polarities are produced in two diagonal directions as shown in the upper portion of FIG. 9.

In the parallelogram-shaped semiconductor region 301*a* with θ<0, the tensile stress dominates the compressive stress. In the parallelogram-shaped semiconductor region 301*c* with θ<0, the compressive stresses overwhelm the tensile stresses. In the parallelogram-shaped semiconductor region 301*b* with θ=0 (i.e., square semiconductor region), the compressive and tensile stresses are equal in magnitude.

Shear stress of S ($N/m^2$) along the perimeter (in absolute value, same for all edges) induces following compressive and tensile stresses (in absolute value) as a function of θ.

$$\text{tensile stress } T = S \cot(\pi/4 + \theta/2)[N/m^2] \tag{1}$$

$$\text{compressive stress } C = S \tan(\pi/4 + \theta/2)[N/m^2] \tag{2}$$

In the lower portion of FIG. 9, these stresses are plotted as functions of θ. It is worth noting that, by setting the angle θ to a positive or negative value, the compressive or tensile stress greater than the applied shear stress can be generated, overwhelming the tensile or compressive stress smaller than the applied shear stress, respectively. Thus, the polarity of the dominant stress and its magnitude can be easily adjusted by the inclination angle θ (radians) of the parallelogram.

Based on the above-explained principle, a parallelogram-shaped semiconductor region in which either compressive or tensile stresses are dominant can be readily formed on a semiconductor.

Thereby, very high speed and fine geometry C-MOSFETs can be manufactured in which channel stresses of both polarities are effectively produced depending on the types of the MOSFETs, even if they are placed in close proximity, without junction leakage and stress cancellation.

An example of such C-MOSFETs is illustrated together with plan views corresponding to the previously described second embodiment.

By the same steps as shown in FIG. 6A in the second embodiment, a plurality of diamond-shaped device formation regions 301 inclined by, say, θ=−π/6 (radian) arranged in a matrix form on a silicon substrate and a silicon nitride layer 304 is then buried around each device formation region, thereby obtaining a structure shown as a plan view in FIG. 10A.

Next, as shown in FIG. 10B, a first pair of diagonally opposite corners 205 of each device formation region is filled with an amorphous SiGe layer 306 containing, say, 50% (atomic concentration) Ge as in the case of FIGS. 6B, 6C and 6D in the second embodiment.

Next, the silicon nitride layer 204 in a second pair of diagonally opposite corners 307 of each device formation regions is removed to thereby completely expose exposing the second pairs of opposing corners in each device formation region.

Figure 10C:
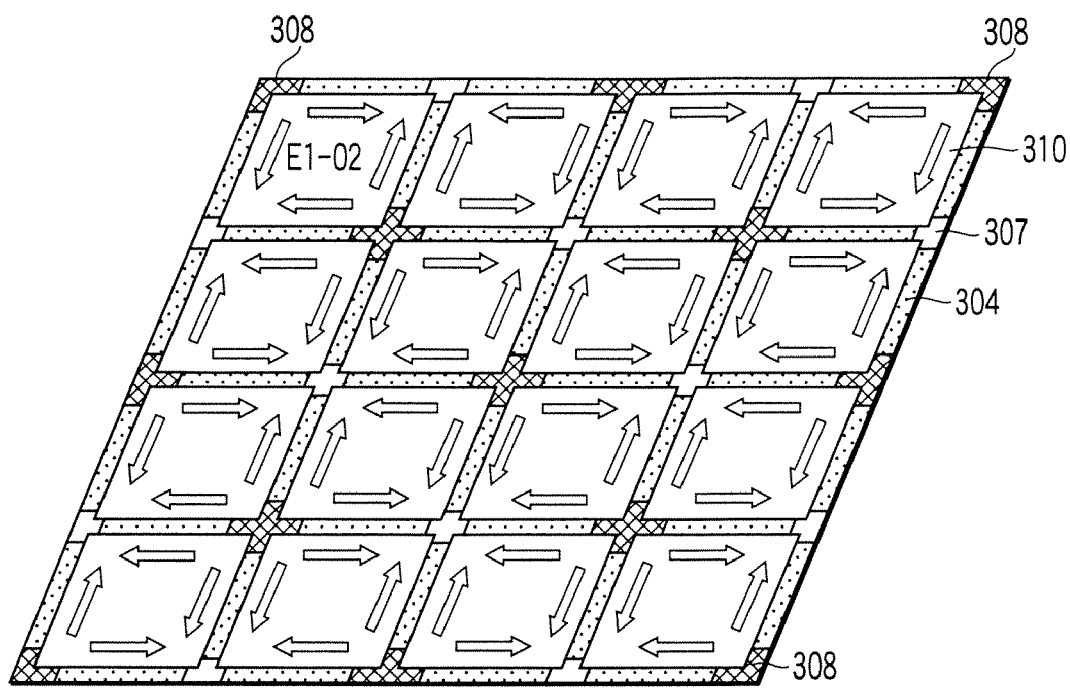

Next, as shown in FIG. 10C, thermal oxidation is carried out as in the case of FIG. 6E in the second embodiment. Since the speed of oxidation of the SiGe layer 306 is very high in comparison with Si, the oxidation mainly proceeds in the buried SiGe layer to form oxidized SiGe layer 308. The SiGe layer 306 expands on oxidation. Thanks to the holes at the opposite corners 307 of silicon nitride layer 304, the nitride layer can be readily displaced towards the directions indicated by white arrows in FIG. 10C, producing sheer strains in each device formation region 301 along the directions also indicated by the white arrows.

Figure 10D:
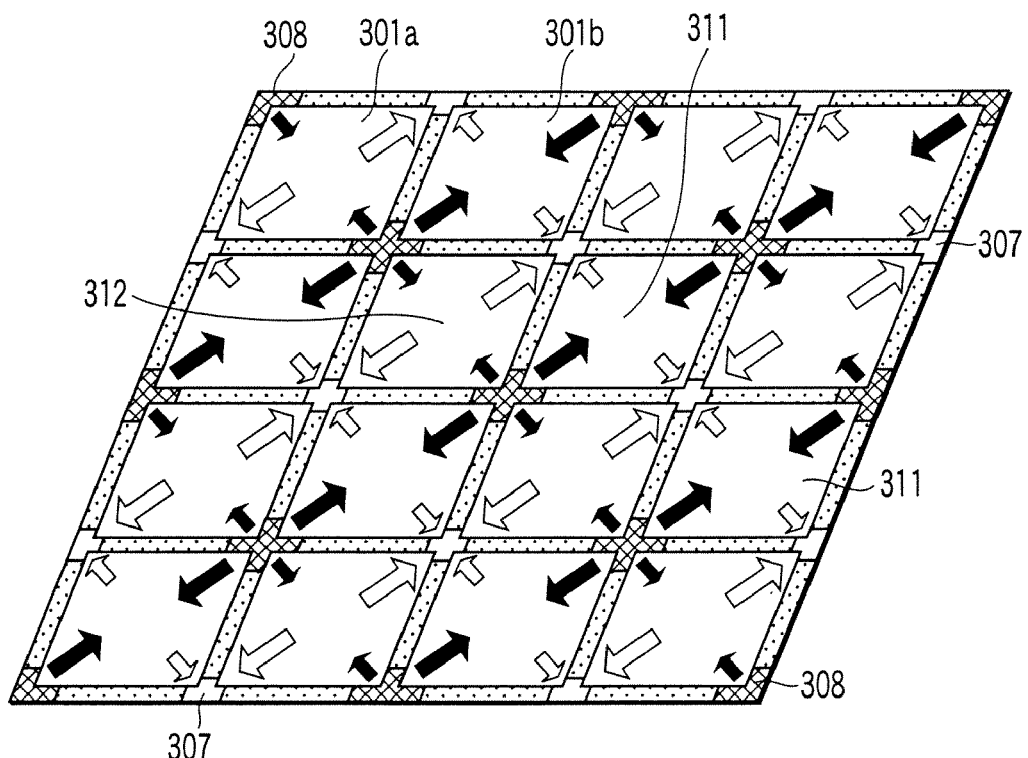

Therefore, in accordance with the principles described in conjunction with FIGS. 8 and 9, dominant tensile stresses are effectively produced along the diagonal direction of the second opposing corners 307 emptied of the silicon nitride layer 304, in the device forming regions 301a, as shown in FIG. 10D. On the other hand, dominant compressive stresses are produced along the diagonal direction of the first opposing corners with the oxidized SiGe layer 308 in the device forming regions 301b.

It should be noted here that, to produce stresses of opposite polarity, it is not required to deposit multiple stress-yielding semiconductor materials of different lattice constants and, hence, the manufacturing steps can be simplified.

In addition, by applying shear stresses to an inclined parallelogram-shaped semiconductor region, compressive or tensile stresses greater than the applied stresses can be effectively produced. In the case of a parallelogram inclined by $\theta=-\pi/6$, the stresses actually produced are 1.7 times larger than the applied stresses.

Furthermore, the directions of compression and tension are alternating between neighboring device formation regions; thus, the global deformation of the entire semiconductor substrate will be prevented. Therefore, the mechanical strength of the semiconductor substrate is retained and the semiconductor wafer can be handled safely and stably during the manufacturing steps.

Figure 10E:
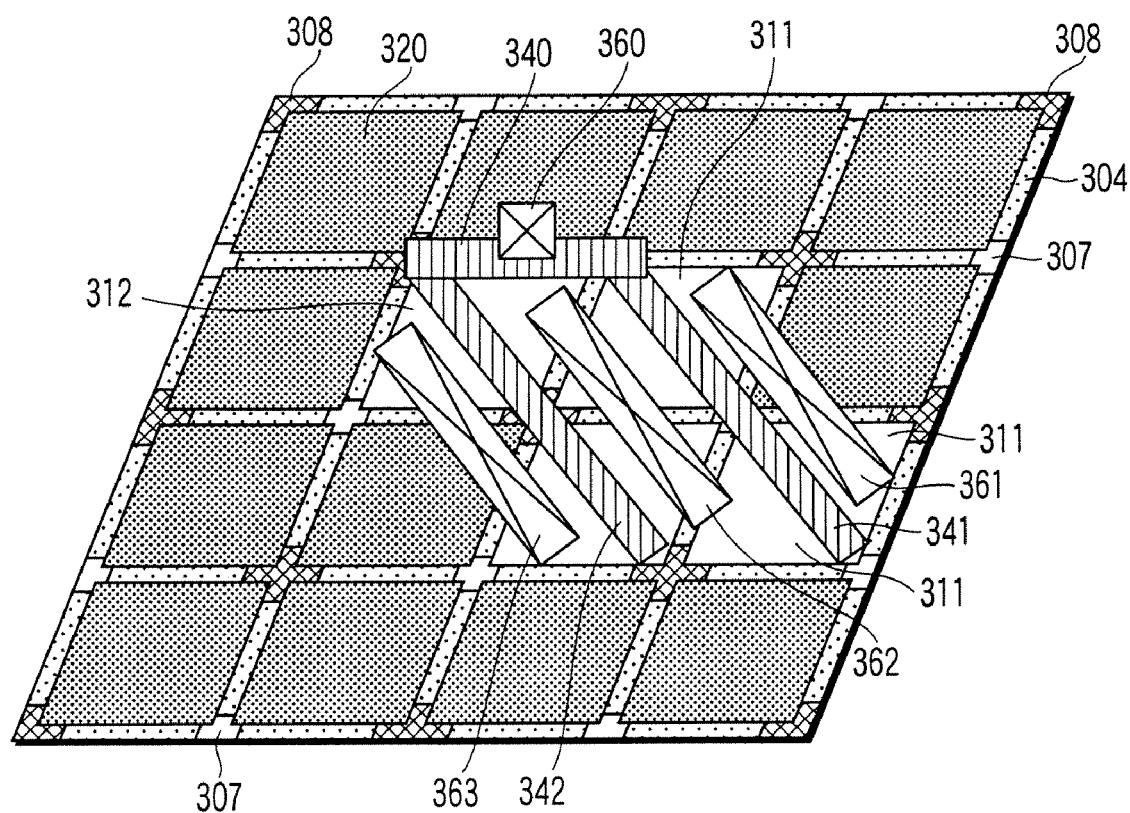

Next, silicon oxide layers 320, (forming buried device isolation regions), a gate insulating film and polysilicon gate electrodes 340, 341 and 342 are formed in accordance with the steps shown in FIGS. 6G through 6J. A p-MOSFET is formed in the device formation regions 311 where dominant compressive stresses are retained and an n-MOSFET is formed in the device formation regions 312 where dominant tensile stresses are retained so that their respective channel directions (i.e., current directions) are aligned along the directions of the dominant stresses for their benefits. As a result, the mobilities of holes (for p-MOSFET) and electrons (for n-MOSFET) increase greatly. Thereby, a C-MOSFET inverter circuit made of high-drive p- and n-MOSFETs, due to enhanced mobilities, can be formed as shown in FIG. 10E. In FIG. 10E, 360, 361, 362 and 363 denote contact holes.

Although, in the third embodiment, one MOSFET is formed across two or more segmental device formation regions, one or more MOSFETs may be formed within a single segmental device formation region. Besides the present embodiment, which has been described in terms of a single C-MOS inverter circuit, the principles of the invention are also applicable to two or more C-MOSFET inverter circuits as well.

In fact, an arbitrary number of C-MOSFETs can be formed besides a C-MOSFET inverter circuit. Of course, to increase the integration density, C-MOSFETs can be also formed in segmental regions utilized as device isolation regions in this particular embodiment.

Needless to say, the actual device components and their arrangement are not restricted to those illustrated in this embodiment.

For example, in this embodiment, a silicon nitride layer is buried around the device formation region. However, this may be replaced with a hard and heat resistant substance, such as TiN.

The substance for volumetric expansion is not also limited to SiGe. With a proper anti-oxidation film, thermal oxidation of Si itself could be utilized. Otherwise, volumetric expansion induced by silicidation (i.e., reaction of Si with a metal), for example, formation of NiSi, CoSi, or PtSi, can also be of use.

Instead of the volumetric expansion, volumetric contraction due to, such as, formation of $CoSi_2$ or $NiSi_2$ can be exploited for stress generation as well. Further, a material that causes volumetric expansion and a material that causes volumetric contraction can be unitized in tandem, replacing SiGe and cavities in this embodiment, respectively.

Although, in this embodiment, shear stresses are produced prior to the formation of C-MOSFETs, they may be generated after the formation of C-MOSFETs, when a volume changing reaction at low temperatures, such as silicidation, is available. Posterior stress generation can avoid a high-temperature heat treatment, which may otherwise cause relaxation of pre-generated stresses.

Furthermore, an SOI substrate may be employed as the silicon substrate. It is also possible to further adjust the stresses in the channels by additionally depositing an insulating film with internal stress over the C-MOSFETs that are already formed.

As has been described in terms of the first, second and third embodiments, the present invention provides the following advantages:

(1) By applying deform displacements along the edges of a rectangular semiconductor region so as to induce shear stresses in the semiconductor region, stresses of different polarity can be simultaneously produced in the semiconductor region: compressive stresses in one diagonal direction in the semiconductor region and tensile tensions in the other diagonal direction. Therefore, by aligning the channel direction (i.e., current direction) of a p-MOSFET parallel to the direction of compression and aligning the channel direction of an n-MOSFET parallel to the direction of tension, the compressive stress and tensile stress are produced along the channel of the p-MOSFET and the n-MOSFET, respectively. As a result, the mobilities of both electrons and holes increase, allowing C-MOSFETs of high-speed operation to be formed.

(2) By inducing the shear strains, compressive and tensile stresses can be produced in the semiconductor region at the same time. Therefore, to produce stresses of opposite polarity, it is not required to deposit multiple stress-yielding semiconductor materials of different lattice constants and, hence, the manufacturing steps can be simplified.

(3) Compression and tension in different directions allows much more easier silicon semiconductor substrate deformation (i.e., with weaker forces) than compression or tension in only one direction.

(4) Since the compressive and tensile stresses are simultaneously produced in different directions, thus, even if the p- and n-MOSFETs are placed in close proximity to each other, the stresses will not cancel out.

(5) It is not required for a foreign stress-yielding semiconductor substance to replace a portion of each of the source and drain regions. Absence of hetero-junctions between channel-forming Si and the source-drain-forming extrinsic semiconductor ensures leakage-free source/drain electrodes for the resulting MOSFET.

(6) When a volume changing reaction at low temperatures, such as silicidation, is available, shear stresses may be generated after the formation of C-MOSFETs, Posterior stress generation can avoid a high-temperature heat treatment, which may otherwise cause relaxation of pre-generated stresses.

(7) By forming a plurality of device formation regions, where the directions of compression and tension are alternating between neighboring device formation regions, the global deformation of the entire semiconductor substrate will be prevented. Therefore, the mechanical strength of the semiconductor substrate is retained and the semiconductor wafer can be handled safely and stably during the manufacturing steps.

(8) A buried silicon nitride layer also serves for device isolation between p- and n-MOSFETs which are adjacent to each other.

(9) By forming one MOSFET across two or more device formation regions, a MOSFET of high driving power (i.e., a wide MOSFET) can be formed freely and concurrently with smaller and narrower MOSFETs.

(10) By dividing a semiconductor substrate into a plurality of alternately strained regions, a number of possible device arrangements for mobility enhancement increases, thus providing greater latitude in circuit layout.

(11) By applying shear stresses to a parallelogram-shaped semiconductor region, compressive or tensile stress greater than the applied stresses can be effectively produced. Moreover, the polarity of the dominant stress and its magnitude can be easily adjusted by the inclination angle θ (radians) of the parallelogram.

(12) By alternating the polarity of the dominant stress between neighboring parallelogram-shaped semiconductor regions, the global deformation of the entire semiconductor substrate can be prevented. Therefore, the mechanical strength of the semiconductor substrate is retained and the semiconductor wafer can be handled safely and stably during the manufacturing steps, while enjoying efficient enhancement of the mobilities of both carriers thanks to the stresses greater than the applied shear.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device of complementary structure comprising:
a semiconductor substrate including: (i) a first planar semiconductor region whose major surface is formed into a shape of a rectangle or a parallelogram and having compressive stress in a first direction along the major surface of the semiconductor region and tensile stress in a second direction along the major surface different from the first direction; and (ii) a second planar semiconductor region whose major surface is parallel to the major surface of the first planar semiconductor region and formed into a shape of a rectangle or a parallelogram and having tensile stress in the first direction along the major surface and compressive stress in the second direction along the major surface;
a field effect transistor of a first conductivity type formed on each major surface of the first planar semiconductor region and the second planar semiconductor region and including source and drain regions separately arranged along the direction of compressive stresses; and
a field effect transistor of a second conductivity type formed on each major surface of the first planar semiconductor region and the second planar semiconductor region and including source and drain regions separately arranged along the direction of tensile stresses.

2. The semiconductor device according to claim 1, wherein the first planar semiconductor region and the second planar semiconductor region are identical in shape and a plurality of first semiconductor regions and a plurality of second semiconductor regions are alternately arranged adjacent to each other on the semiconductor substrate.

3. The semiconductor device according to claim 1, wherein at least a portion of the field effect transistor of the first conductivity type or the second conductivity type is formed across the first planar semiconductor region and the second planar semiconductor region.

4. The semiconductor device according to claim 1, wherein a groove is formed around each of the first planar semiconductor region and the second planar semiconductor region and filled with a first material except for four corners of each of the first planar semiconductor region and the second planar semiconductor region, the first material being higher in elastic modulus than the first planar semiconductor region and the second planar semiconductor region, and filled with a second material at two diagonally opposite corners of the four corners of each of the first planar semiconductor region and the second planar semiconductor region, the second material formed of a material obtainable by a chemical change causing volumetric expansion.

5. The semiconductor device according to claim 4, wherein the first material is silicon nitride, and the second material is an oxide of silicon or a mixture of silicon and germanium.

6. The semiconductor device according to claim 4, wherein remaining two corners of the groove other than the two corners of the groove which are filled with the second material in each of the first planar semiconductor region and the second planar semiconductor region are filled with a third material which differs from the second material and is obtainable from a volume changing chemical reaction different from the volumetric expansion of the second material.

7. The semiconductor device according to claim 1, wherein each of the first planar semiconductor region and the planar second semiconductor regions is made of silicon, the first conductivity type is p type, and the second conductivity type is n type.

* * * * *